United States Patent
Lee et al.

(10) Patent No.: US 11,867,643 B2
(45) Date of Patent: Jan. 9, 2024

(54) PLANAR-TYPE PLASMA DIAGNOSIS APPARATUS, WAFER-TYPE PLASMA DIAGNOSIS APPARATUS IN WHICH PLANAR-TYPE PLASMA DIAGNOSIS APPARATUS IS BURIED, AND ELECTROSTATIC CHUCK IN WHICH PLANAR-TYPE PLASMA DIAGNOSIS APPARATUS IS BURIED

(71) Applicant: KOREA RESEARCH INSTITUTE OF STANDARDS AND SCIENCE, Daejeon (KR)

(72) Inventors: Hyo Chang Lee, Sejong-si (KR); Jung Hyung Kim, Daejeon (KR); Dae Jin Seong, Gongju-si (KR); Hee Jung Yeom, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 624 days.

(21) Appl. No.: 17/050,373

(22) PCT Filed: Apr. 15, 2019

(86) PCT No.: PCT/KR2019/004500
§ 371 (c)(1),
(2) Date: Oct. 23, 2020

(87) PCT Pub. No.: WO2020/159003
PCT Pub. Date: Aug. 6, 2020

(65) Prior Publication Data
US 2021/0116393 A1 Apr. 22, 2021

(30) Foreign Application Priority Data

Jan. 31, 2019 (KR) .................. 10-2019-0012572
Mar. 21, 2019 (KR) .................. 10-2019-0032099
Mar. 21, 2019 (KR) .................. 10-2019-0032117

(51) Int. Cl.
*G01N 22/00* (2006.01)
*H01J 37/32* (2006.01)
(Continued)

(52) U.S. Cl.
CPC .......... *G01N 22/00* (2013.01); *H01J 37/3222* (2013.01); *H01J 37/32715* (2013.01);
(Continued)

(58) Field of Classification Search
CPC .. G01N 22/00; H01Q 21/065; H01Q 21/0031; H05H 1/0006; H05H 1/0062
See application file for complete search history.

(56) References Cited

U.S. PATENT DOCUMENTS

2002/0173059 A1* 11/2002 Ma .................. H01J 37/32935
257/E21.528
2003/0117321 A1 6/2003 Furse et al.
(Continued)

FOREIGN PATENT DOCUMENTS

FR 2876536 A1 4/2006
JP 0927476 A 1/1997
(Continued)

OTHER PUBLICATIONS

International Search Report of PCT/KR2019/004500, dated Oct. 29, 2019, English translation.
(Continued)

*Primary Examiner* — Dominic E Hawkins
(74) *Attorney, Agent, or Firm* — STIP Law Group, LLC

(57) ABSTRACT

The present invention relates to a planar-type plasma diagnosis apparatus comprising: a transmission antenna for applying a frequency-variable microwave to plasma; a reception antenna for receiving the microwave from the
(Continued)

plasma; and a body part encompassing the transmission antenna and the reception antenna so that same are insulated from each other, wherein the upper surface of the transmission antenna for applying the microwave and the upper surface of the reception antenna for receiving the microwave are planar, and side surfaces of the upper surfaces of the transmission antenna and the reception antenna face each other.

20 Claims, 21 Drawing Sheets

(51) Int. Cl.
    *H01L 21/683*     (2006.01)
    *H01Q 1/24*     (2006.01)
    *H01Q 1/52*     (2006.01)
    *H01Q 9/02*     (2006.01)
    *H01Q 21/00*     (2006.01)
    *H01Q 21/06*     (2006.01)

(52) U.S. Cl.
    CPC .... *H01J 37/32935* (2013.01); *H01L 21/6833* (2013.01); *H01Q 1/24* (2013.01); *H01Q 1/523* (2013.01); *H01Q 1/525* (2013.01); *H01Q 9/02* (2013.01); *H01Q 21/0031* (2013.01); *H01Q 21/065* (2013.01); *H01J 2237/2007* (2013.01)

(56) References Cited

U.S. PATENT DOCUMENTS

2004/0263190 A1* 12/2004 Benjamin ............... H01L 22/34
    324/750.3
2012/0255491 A1   10/2012 Hadidi
2016/0123927 A1*  5/2016 Persson ............... G01N 27/628
    315/111.21
2018/0374680 A1* 12/2018 Ikeda ............... H01L 21/67739

FOREIGN PATENT DOCUMENTS

| JP | H10509557 A | | 9/1998 | |
|---|---|---|---|---|
| JP | 2003243370 A | | 8/2003 | |
| JP | 2014170668 A | | 9/2014 | |
| KR | 100473794 B1 | | 3/2005 | |
| KR | 1020080068012 A | | 7/2008 | |
| KR | 101225010 B1 | | 1/2013 | |
| KR | 101456542 B1 | | 10/2014 | |
| KR | 20170069652 A | * | 12/2015 | ........... H05H 1/0012 |
| KR | 20170069652 A | | 6/2017 | |
| KR | 101756325 B1 | | 7/2017 | |
| WO | WO2015188608 A1 | | 12/2015 | |

OTHER PUBLICATIONS

D W Kim et al, Planar cutoff probe for measuring the electron density of low-pressure plasmas, Plasma Sources Science and Technology, Jan. 17, 2019, vol. 28, Issue 01500, IOP Publishing Ltd, Bristol, United Kingdom.

The extended European search report of EP 19 91 2976, dated May 19, 2021.

H J Yeom et al, Flat cutoff probe for real-time electron density measurement in industrial plasma processing, Plasma Sources Science and Technology, 2020, vol. 29, Issue 035016, pp. 1-13, IOP Publishing Ltd, Bristol, United Kingdom.

* cited by examiner (a)

(b)

PLANAR-TYPE PLASMA DIAGNOSIS APPARATUS, WAFER-TYPE PLASMA DIAGNOSIS APPARATUS IN WHICH PLANAR-TYPE PLASMA DIAGNOSIS APPARATUS IS BURIED, AND ELECTROSTATIC CHUCK IN WHICH PLANAR-TYPE PLASMA DIAGNOSIS APPARATUS IS BURIED

CROSS-REFERENCE TO RELATED APPLICATIONS

This application is the U.S. National Phase under 35 U.S.C. § 371 of International Application No. PCT/KR2019/004500 filed on Apr. 15, 2019, which in turn claims the benefit of Korean Application No. 10-2019-0012572 filed on Jan. 31, 2019, 10-2019-0032099 filed on Mar. 21, 2019, 10-2019-0032117 filed on Mar. 21, 2019, the disclosures of which are incorporated by reference into the present application.

TECHNICAL FIELD

The present invention relates to a planar-type plasma diagnosis apparatus, and provides a planar-type plasma diagnosis apparatus capable of obtaining plasma density from a cut-off frequency by forming an ultra-high frequency transmission/reception antenna for measuring the plasma cut-off frequency in a planar-type.

Further, the present invention relates to a wafer-type plasma diagnosis apparatus in which a planar-type plasma diagnosis apparatus is buried, and provides a wafer-type plasma diagnosis apparatus in which a planar-type plasma diagnosis apparatus capable of obtaining plasma density from a cut-off frequency by forming an ultra-high frequency transmission/reception antenna for measuring the plasma cut-off frequency in a planar-type is buried in a circular member.

In addition, the present invention relates to an electrostatic chuck in which a planar-type plasma diagnosis apparatus is buried, and provides an electrostatic chuck in which a planar-type plasma diagnosis apparatus is buried formed by burying the planar-type plasma diagnosis apparatus capable of obtaining plasma density from a cut-off frequency by forming an ultra-high frequency transmission/reception antenna for measuring the plasma cut-off frequency in a planar-type in the electrostatic chuck.

BACKGROUND ART

Since application fields of plasma are expanded in various ways, the importance of plasma diagnosis technology also increases. As a conventional method of diagnosing plasma, a method of applying an electric potential by inserting an electrostatic probe into the plasma has a problem in that a high electric potential can change the plasma and thus a plasma parameter such as plasma density is difficult to be accurately measured.

In order to solve a problem of the electrostatic probe, a cut-off probe method was developed as a plasma diagnosis method using microwaves, and a cut-off probe can include a probe which emits electromagnetic waves and a probe which receives the electromagnetic waves, and use microwaves in a range of several hundred MHz to tens of GHz to measure plasma density.

When a frequency of the microwave is smaller than a plasma frequency, the microwave does not pass through the plasma, and when the frequency of the microwave is greater than the plasma frequency, the microwave passes through the plasma, and a frequency at this point is called a cut-off frequency, and plasma density can be obtained from this cut-off frequency.

Registered Patent Publication No. 10-0473794 relates to a plasma electron density measuring apparatus in a structure having a frequency probe in an antenna structure, and FIG. 22 illustrates a specific shape of a transmission/reception antenna of a bar-shaped probe, and since the plasma electron density measuring apparatus has a method of inserting the frequency probe into the plasma, there is a problem in that structural interference with the plasma can be caused, and measurement accuracy is low due to perturbation of surrounding plasma density by probe insertion.

Registered Patent Publication No. 10-1225010 relates to an ultra-high frequency probe having a bar-shaped radiation antenna and a loop-shaped reception antenna, and FIG. 23 illustrates a specific shape of the bar-shaped radiation antenna and the loop-shaped reception antenna, and since the ultra-high frequency probe increases a reception rate by forming the reception antenna in a loop shape but has a method of inserting a frequency probe into the plasma, there is a problem in that structural interference with the plasma can be caused.

Laid-Open Patent Publication No. 10-2017-0069652 relates to a planar ring-type ultra-high frequency plasma diagnosis apparatus, and FIG. 24 illustrates a specific shape of the planar ring-type plasma diagnosis apparatus, and in order to detect a cut-off frequency of plasma and measure plasma density, a transmission antenna and a reception antenna are disposed in a concentric structure, and the reception antenna is formed in a ring shape to surround the transmission antenna. However, such a planar ring-type ultra-high frequency plasma diagnosis apparatus has a problem in that the plasma density is difficult to be reliably measured due to a resonance signal attributed to structural characteristics.

Registered Patent Publication No. 10-1756325 relates to a planar conical-type plasma diagnosis apparatus, and FIG. 25 illustrates a specific shape of the planar conical-type plasma diagnosis apparatus, and in order to detect a cut-off frequency of plasma and measure plasma density, a transmission antenna and a reception antenna are each formed in a conical shape. However, such a planar conical-type cut-off probe has a problem in that since intensity of a transmitted signal is too low, it is difficult to measure the plasma density.

DISCLOSURE

Technical Problem

The present invention is directed to enable reliable plasma density measurement by increasing capacitive coupling between transmission/reception antennas to prevent structural interference and increase the intensity of a transmitted signal.

Further, the present invention is directed to enable reliable plasma density measurement by preventing a resonance signal due to structural characteristics.

In addition, the present invention is directed to enable plasma density measurement by burying a plasma diagnosis apparatus in a wafer-shaped circular member to minimize structural changes of a plasma chamber.

In addition, the present invention is directed to enable real time plasma density measurement during a plasma process by burying a plasma diagnosis apparatus in an electrostatic chuck.

In addition, the present invention is directed to enable real time plasma density measurement near a wafer during a plasma process by burying a plasma diagnosis apparatus in an electrostatic chuck.

In addition, the present invention is directed to enable the measurement of the uniformity of a plasma space at low cost.

Problems to be solved by the present invention are not limited to the above-described purposes, and other technical problems not clearly mentioned in the above may be understood by those skilled in the art through the following configurations and actions of the present invention.

Technical Solution

The present invention includes the following configurations to solve the above problems.

One aspect of the present invention provides a planar-type plasma diagnosis apparatus including: a transmission antenna configured to apply a frequency-variable microwave to plasma; a reception antenna configured to receive the microwave from the plasma; and a body part configured to encompass the transmission antenna and the reception antenna so that the transmission antenna and the reception antenna are insulated from each other, wherein each of an upper surface of the transmission antenna configured to apply the microwave and an upper surface of the reception antenna configured to receive the microwave has a planar shape, and side surfaces of the upper surfaces of the transmission antenna and the reception antenna face each other.

In the present invention, each of the upper surfaces of the planar-type transmission antenna and the planar-type reception antenna may have a quadrangular shape.

In the present invention, the planar-type transmission antenna and the planar-type reception antenna may have rectangular parallelepiped shapes disposed in the body part to be adjacent to each other and face each other.

In the present invention, an interval (D) between the upper surface of the transmission antenna and the upper surface of the reception antenna may range from 1 mm to 15 mm.

In the present invention, insulating films may be respectively formed on the upper surface of the transmission antenna and the upper surface of the reception antenna.

In the present invention, a longitudinal length of the upper surface may be greater than a lateral length of the upper surface, and the longitudinal length of the upper surface of the transmission antenna and the longitudinal length of the upper surface of the reception antenna may be disposed to face each other.

In the present invention, the longitudinal length of each of the upper surfaces of the transmission antenna and the reception antenna may range from 2 mm to 30 mm.

In the present invention, the lateral length of each of the upper surfaces of the transmission antenna and the reception antenna may range from 0.1 mm to 10 mm.

In the present invention, a cable configured to transmit or receive an ultra-high frequency may be connected through a lower surface of the transmission antenna or the reception antenna facing the upper surface of the transmission antenna or the reception antenna.

In the present invention, the cable configured to transmit or receive the ultra-high frequency may be connected in a range from a center of a longitudinal length of the lower surface to a quarter of the longitudinal length.

Further, another aspect of the present invention provides a planar-type plasma diagnosis apparatus including: a transmission antenna configured to apply a frequency-variable microwave to plasma; a reception antenna configured to receive the microwave from the plasma; and a body part configured to encompass the transmission antenna and the reception antenna so that the transmission antenna and the reception antenna are insulated from each other, wherein each of an upper surface of the transmission antenna configured to apply the microwave and an upper surface of the reception antenna configured to receive the microwave has a semicircular planar shape, and chords of the upper surfaces of the transmission antenna and the reception antenna face each other.

In the present invention, the transmission antenna and the reception antenna may have semicircular pillar shapes disposed in the body part to be adjacent to each other and face each other.

Further, still another aspect of the present invention provides a planar-type plasma diagnosis apparatus including: a transmission antenna configured to apply a frequency-variable microwave to plasma; a reception antenna configured to receive the microwave from the plasma; and a body part configured to encompass the transmission antenna and the reception antenna so that the transmission antenna and the reception antenna are insulated from each other, wherein each of an upper surface of the transmission antenna configured to apply the microwave and an upper surface of the reception antenna configured to receive the microwave has a planar shape, side surfaces of the upper surfaces of the transmission antenna and the reception antenna face each other, and pillar portions are formed to extend from the upper surfaces.

In addition, yet another aspect of the present invention provides a wafer-type plasma diagnosis apparatus with a planar-type plasma diagnosis apparatus buried therein, including a circular member in which at least one planar-type plasma diagnosis apparatus is buried, wherein the planar-type plasma diagnosis apparatus includes a transmission antenna configured to apply a frequency-variable microwave to plasma, a reception antenna configured to receive the microwave from the plasma, and a body part configured to encompass the transmission antenna and the reception antenna so that the transmission antenna and the reception antenna are insulated from each other, each of an upper surface of the transmission antenna configured to apply the microwave and an upper surface of the reception antenna configured to receive the microwave has a planar shape, and side surfaces of the upper surfaces of the transmission antenna and the reception antenna face each other.

In the present invention, the planar-type plasma diagnosis apparatus may be buried in a center portion or an edge of the circular member.

In the present invention, the planar-type plasma diagnosis apparatus may be buried in plurality in the circular member.

In the present invention, the planar-type plasma diagnosis apparatus may be radially buried in plurality from the center portion of the circular member.

In the present invention, the planar-type plasma diagnosis apparatus may be buried in plurality in the circular member in a lattice shape or a cross shape.

In the present invention, the wafer-type plasma diagnosis apparatus may further include a spectrum analyzer connected to the plurality of planar-type plasma diagnosis apparatuses in parallel, wherein lengths of wires of the spectrum analyzer connected to the plurality of planar-type plasma diagnosis apparatuses may be different from each other.

In the present invention, the wafer-type plasma diagnosis apparatus may further include a switching circuit and a spectrum analyzer connected to the plurality of planar-type plasma diagnosis apparatuses, wherein the switching circuit may sequentially operate the plurality of planar-type plasma diagnosis apparatuses to be connected to the spectrum analyzer.

Further, yet another aspect of the present invention provides an electrostatic chuck in which a planar-type plasma diagnosis apparatus is buried, wherein the planar-type plasma diagnosis apparatus includes a transmission antenna configured to apply a frequency-variable microwave to plasma, a reception antenna configured to receive the microwave from the plasma, and a body part configured to encompass the transmission antenna and the reception antenna so that the transmission antenna and the reception antenna are insulated from each other, each of an upper surface of the transmission antenna configured to apply the microwave and an upper surface of the reception antenna configured to receive the microwave has a planar shape, side surfaces of the upper surfaces of the transmission antenna and the reception antenna face each other, and the planar-type plasma diagnosis apparatus is buried in a surface of the electrostatic chuck.

In the present invention, the planar-type plasma diagnosis apparatus may be buried in a center portion or an edge of the electrostatic chuck.

In the present invention, the planar-type plasma diagnosis apparatus may be buried in plurality in the electrostatic chuck.

In the present invention, the planar-type plasma diagnosis apparatus may be radially buried in plurality from the center portion of the electrostatic chuck.

In the present invention, the planar-type plasma diagnosis apparatus may be buried in plurality in a lattice shape or a cross shape.

In the present invention, the electrostatic chuck may further include a spectrum analyzer connected to the plurality of planar-type plasma diagnosis apparatuses in parallel, wherein lengths of wires of the spectrum analyzer connected to the plurality of planar-type plasma diagnosis apparatuses may be different from each other.

In the present invention, the electrostatic chuck may further include a switching circuit and a spectrum analyzer connected to the plurality of planar-type plasma diagnosis apparatuses, wherein the switching circuit may sequentially operate the plurality of planar-type plasma diagnosis apparatuses to be connected to the spectrum analyzer.

Advantageous Effects

According to the present invention, there is an effect of enabling reliable plasma density measurement by increasing capacitive coupling between transmission/reception antennas to prevent structural interference and increase the intensity of a transmitted signal.

Further, according to the present invention, there is an effect of enabling reliable plasma density measurement by preventing a resonance signal due to structural characteristics.

In addition, according to the present invention, there is an effect of enabling plasma density measurement by burying a plasma diagnosis apparatus in a wafer-shaped circular member to minimize structural changes of a plasma chamber.

In addition, according to the present invention, there is an effect of enabling real time plasma density measurement during a plasma process by burying a plasma diagnosis apparatus in an electrostatic chuck.

In addition, according to the present invention, there is an effect of enabling real time plasma density measurement near a wafer during a plasma process by burying a plasma diagnosis apparatus in an electrostatic chuck.

In addition, according to the present invention, there is an effect of enabling the measurement of the uniformity of a plasma space at low cost.

Effects of the present invention are not limited to the above-described effects, and other effects not clearly mentioned above may be understood by those skilled in the art through the following configurations and actions of the present invention.

MODES OF THE INVENTION

Hereinafter, overall configurations and actions according to preferable embodiments of the present invention will be described. These embodiments are exemplary, and do not limit the configurations and actions of the present invention, and other configurations and actions not explicitly shown in the embodiments may also be seen as the technical spirit of the present invention when easily understood by those skilled in the art through the following embodiments of the present invention.

Hereinafter, overall configurations and actions according to a specific embodiment of the present invention will be described.

Figure 1A:
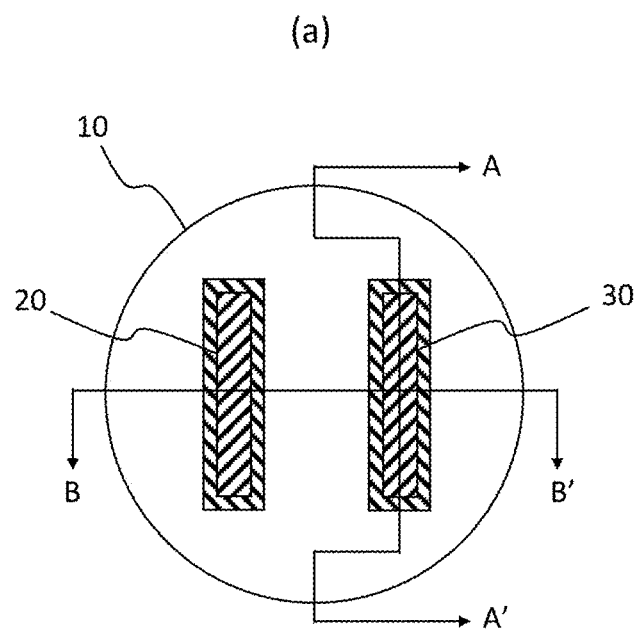
FIG. 1(a), FIG. 1(b) and FIG. 1(c) are a view of a planar-type plasma diagnosis apparatus of the present invention, and illustrates (a) a plan view, (b) a right side view, and (c) a lower side view.
Figure 1B:
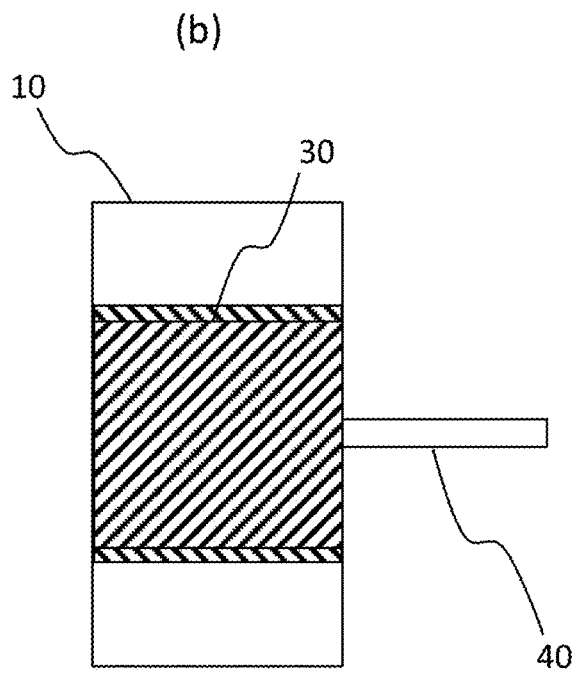
Figure 1C:
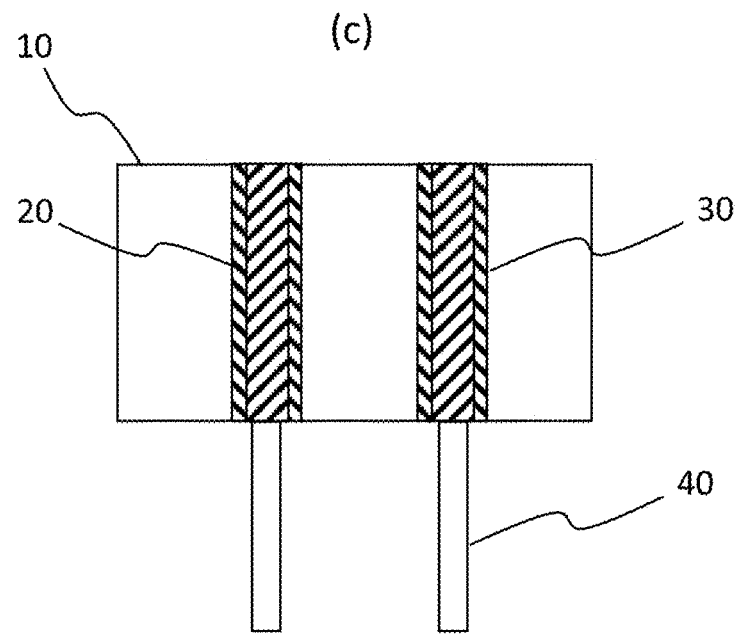
Figure 2:
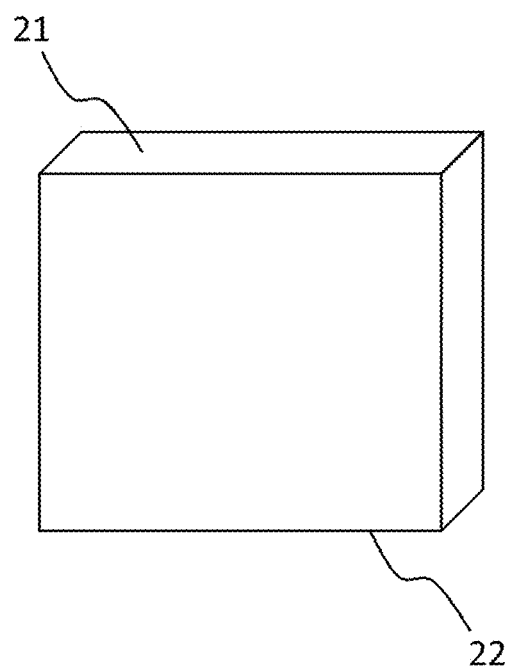
FIG. 2 illustrates one embodiment of a specific shape of a transmission/reception antenna of the planar-type plasma diagnosis apparatus of the present invention.

FIG. 1 is a view of a planar-type plasma diagnosis apparatus of the present invention, and illustrates (a) a plan view, (b) a right side view, and (c) a lower side view, and FIG. 2 illustrates one embodiment of a specific shape of a transmission/reception antenna of the planar-type plasma diagnosis apparatus of the present invention.

Referring to FIG. 1, the present invention relates to the planar-type plasma diagnosis apparatus, and includes a transmission antenna 20 which applies a frequency-variable microwave to plasma, a reception antenna 30 which receives the microwave from the plasma, and a body part 10 which encompasses the transmission antenna 20 and the reception antenna 30 so that the transmission antenna 20 and the reception antenna 30 are insulated from each other, wherein each of an upper surface of the transmission antenna 20 which applies the microwave and an upper surface of the reception antenna of the reception antenna 30 which receives the microwave has a planar shape, and side surfaces of the upper surfaces of the transmission antenna 20 and the reception antenna 30 face each other.

Accordingly, in the present invention, since the side surfaces of the transmission antenna 20 and the reception antenna 30 are disposed to face each other, as capacitive coupling increases, the intensity of a transmission signal becomes stronger, and extraction of a peak value of a transmission coefficient by structural resonances characteristic of the plasma chamber and the plasma diagnosis apparatus may be prevented.

The plan view of FIG. 1 illustrates each of the upper surface of the transmission antenna 20 and the upper surface of the reception antenna 30 in a planar shape, and the right side view illustrates a longitudinally cut surface of the reception antenna 30, and the lower side view illustrates laterally cut surfaces of the transmission antenna 20 and the reception antenna 30.

Further, the lower side view illustrates a cable connected through a lower surface of the transmission antenna 20 facing the upper surface of the transmission antenna 20 to transmit an ultra-high frequency, and the right side view and the lower side view illustrate a cable connected through a lower surface of the reception antenna 30 facing the upper surface of the reception antenna 30 to receive the ultra-high frequency.

Referring to FIG. 2, the planar-type transmission antenna 20 and the planar-type reception antenna 30 have rectangular parallelepiped shapes disposed in the body part 10 to be adjacent to and face each other, and upper surfaces 21 of the planar-type transmission antenna and the planar-type reception antenna may each have a quadrangular shape, and lower surfaces 22 may also each have a quadrangular shape. Further, an insulating film may be formed on the upper surface 21 of the transmission antenna 20 and the upper surface 21 of the reception antenna 30.

Figure 3:
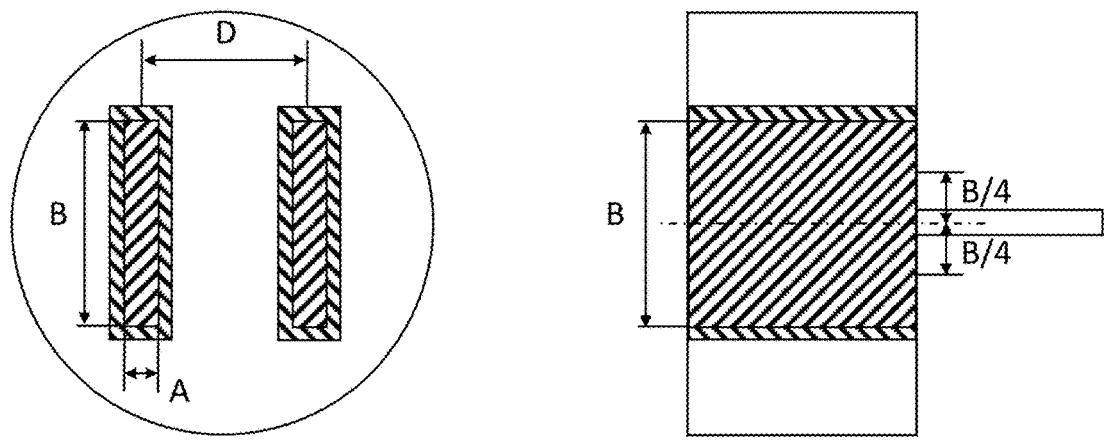
FIG. 3 is a view of the planar-type plasma diagnosis apparatus of the present invention, and illustrates specific reference symbols in a plan view and a right side view.

FIG. 3 is a view of the planar-type plasma diagnosis apparatus of the present invention, and illustrates specific reference symbols in a plan view and a right side view.

Referring to FIG. 3, an interval D between the upper surface 21 of the transmission antenna 20 and the upper surface 21 of the reception antenna 30 ranges from 1 mm to 15 mm, and a longitudinal length B of the upper surface 21 is greater than a lateral length of the upper surface 21, and the upper surface 21 of the transmission antenna 20 and the upper surface 21 of the reception antenna 30 are disposed so that the longitudinal length B of the upper surface 21 of the transmission antenna 20 and the longitudinal length B of the upper surface 21 of the reception antenna 30 face each other.

Each of the longitudinal length B of the upper surface 21 of the transmission antenna 20 and the longitudinal length B of the upper surface 21 of the reception antenna 30 may range from 2 mm to 30 mm, and each of lateral lengths A of the upper surfaces 21 of the transmission antenna 20 and the reception antenna 30 may range from 0.1 mm to 10 mm.

Further, a cable 40 which transmits or receives an ultra-high frequency may be connected through the lower surfaces 22 of the transmission antenna 20 and the reception antenna 30 facing the upper surfaces 21 of the transmission antenna 20 and the reception antenna 30, and a cable 40 which transmits or receives the ultra-high frequency may be connected in a range from a center of the longitudinal length B of the lower surface 22 to a quarter of the longitudinal length B.

In the semiconductor process and display process conditions, since the plasma density ranges from $1\times10^9$ cm$^{-3}$ to $5\times10^{11}$ cm$^{-3}$, and a corresponding cut-off frequency ranges from 300 MHz to 6 GHz, when the cut-off frequency is extracted, extraction of the cut-off frequency is difficult due to cavity characteristics attributed to a structure of the plasma diagnosis apparatus, that is, structural resonance characteristics of the plasma chamber and the plasma diagnosis apparatus in a corresponding region, and thus reliable plasma density measurement becomes difficult.

Figure 4A:
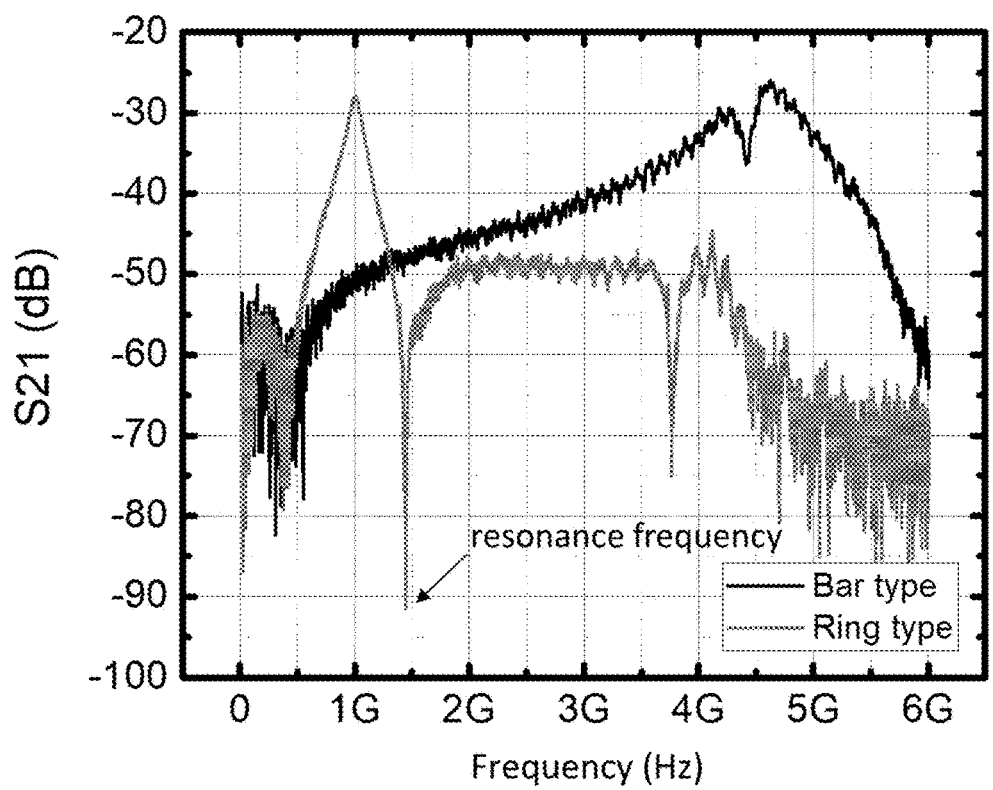
FIG. 4A illustrates a comparison of frequency spectrums of transmission coefficients of the present invention and a conventional planar ring-type plasma diagnosis apparatus in a plasma chamber in a vacuum state.
Figure 4B:
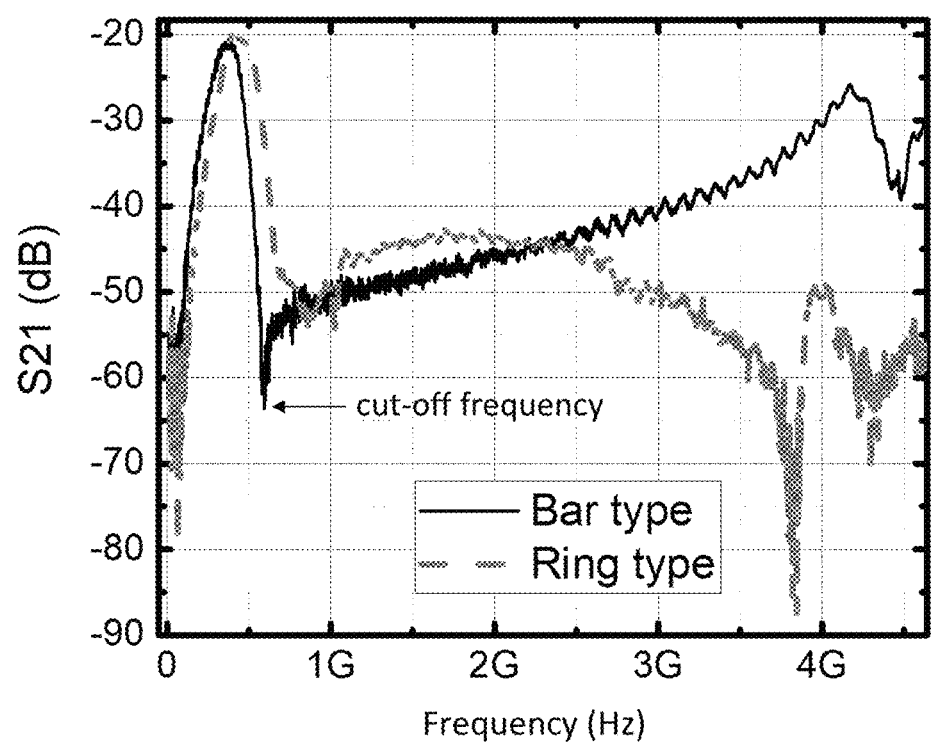
FIG. 4B illustrates a comparison of frequency spectrums of transmission coefficients of the present invention and the conventional planar ring-type plasma diagnosis apparatus in the plasma chamber in which plasma is generated.

FIG. 4A illustrates a comparison of frequency spectrums of transmission coefficients of the present invention and a conventional planar ring-type plasma diagnosis apparatus in a plasma chamber in a vacuum state, and FIG. 4B illustrates a comparison of frequency spectrums of transmission coefficients of the present invention and the conventional planar ring-type plasma diagnosis apparatus in the plasma chamber in which plasma is generated.

Referring to FIG. 4A, a peak value of a transmission coefficient is extracted in the frequency spectrum of the transmission coefficient of the conventional planar ring-type plasma diagnosis apparatus in a vacuum plasma chamber, in which plasma is not generated, at 1 GHz to 2 GHz due to structural resonance characteristics of the plasma chamber and the plasma diagnosis apparatus, but in the frequency spectrum of the transmission coefficient of the present invention, the peak value of the transmission coefficient due to the structural resonance characteristics of the plasma chamber and the plasma diagnosis apparatus is not extracted.

Referring to FIG. 4B, it is difficult to distinguish a cut-off frequency near 1 GHz in the frequency spectrum of the transmission coefficient of the conventional planar ring-type plasma diagnosis apparatus in the plasma chamber, in which plasma is generated, but in the frequency spectrum of the transmission coefficient of the present invention, the cut-off frequency is clearly extracted in a range of 0.5 GHz to 1 GHz.

Accordingly, in the present invention, extraction of the cut-off frequency is easy compared to the conventional planar ring-type plasma diagnosis apparatus, and accordingly, reliable plasma density measurement may be performed.

Figure 5:
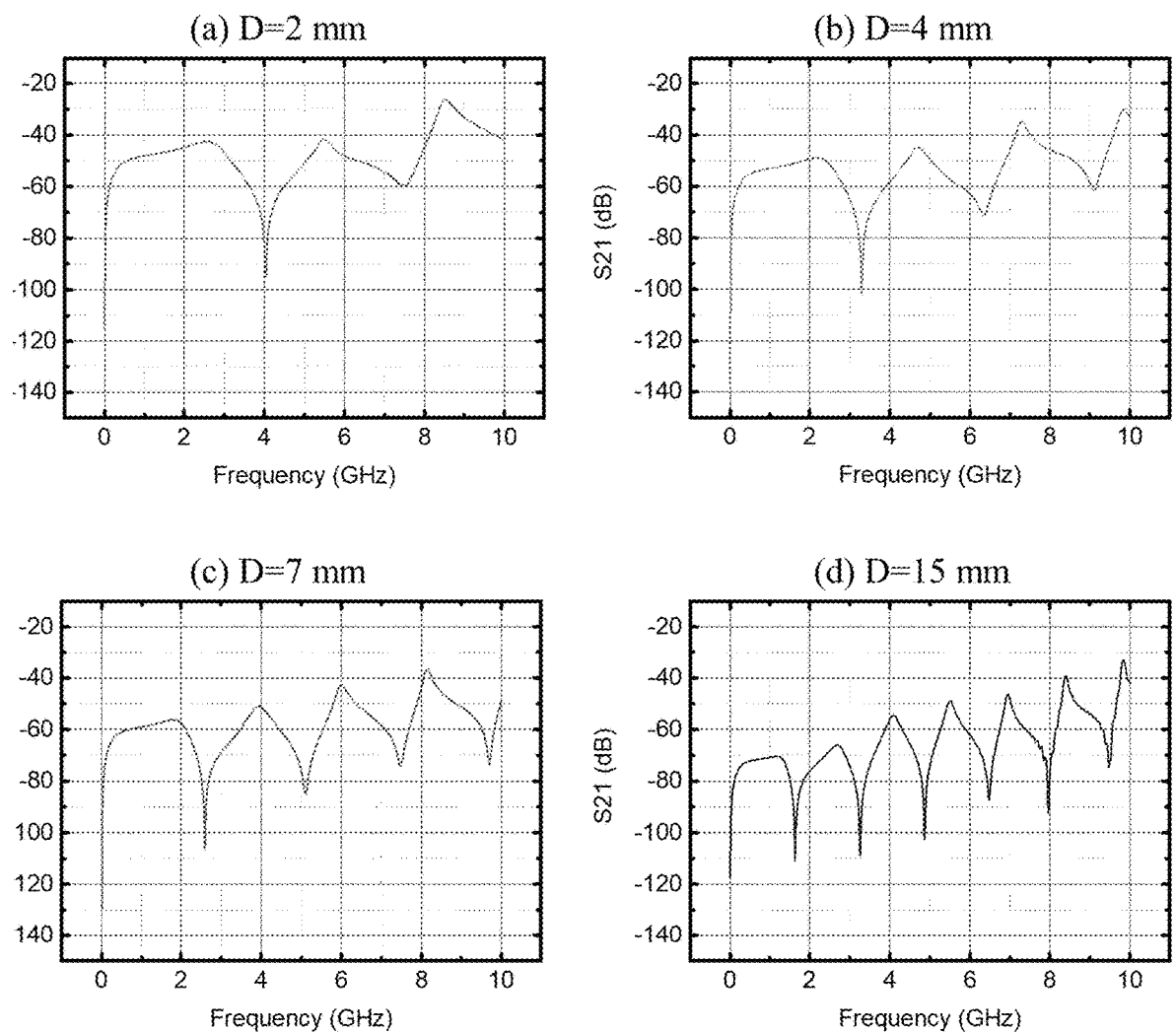
FIG. 5 illustrates a frequency spectrum of a transmission coefficient according to an interval (D) of transmission/reception antennas of the conventional planar ring-type plasma diagnosis apparatus in a vacuum plasma chamber.
Figure 6:
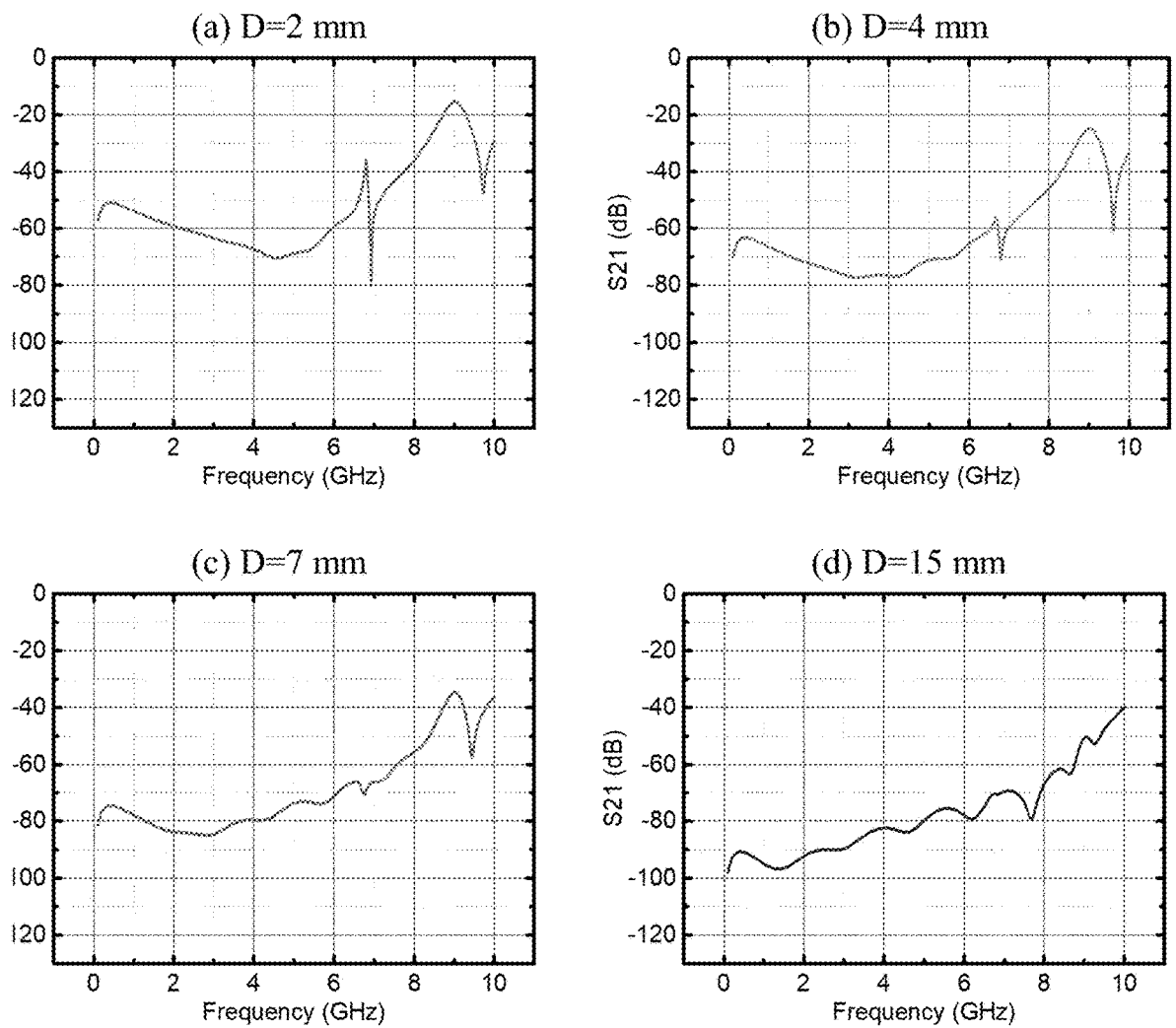
FIG. 6 illustrates a frequency spectrum of a transmission coefficient according to the interval (D) of the transmission/reception antennas of the present invention in a vacuum plasma chamber.

FIG. 5 illustrates a frequency spectrum of a transmission coefficient according to an interval D of transmission/reception antennas of the conventional planar ring-type plasma diagnosis apparatus in the vacuum plasma chamber, and FIG. 6 illustrates a frequency spectrum of a transmission coefficient according to an interval D of transmission/reception antennas of the present invention in the vacuum plasma chamber.

Referring to FIG. 5, in the conventional planar ring-type plasma diagnosis apparatus, since the interval D of the transmission/reception antennas increases to 2 mm, 4 mm, 7 mm, and 15 mm, and the number of peak values of the transmittance coefficient attributed to the structural resonance characteristics of the plasma chamber and the plasma diagnosis apparatus is extracted more, when the plasma frequency is located near the peak value of the transmission coefficient, it is difficult to extract the plasma frequency.

Referring to FIG. 6, in the present invention, since the peak value of the transmission coefficient is in a high frequency region near 7 GHz due to the structural resonance characteristics of the plasma chamber and the plasma diagnosis apparatus, and the interval D of the transmission/reception antennas increases to 2 mm, 4 mm, 7 mm, and 15 mm, and thus peak values of the transmittance coefficient attributed to the structural resonance characteristics of the plasma chamber and the plasma diagnosis apparatus rather disappear, extraction of the plasma frequency is not affected.

Accordingly, in the present invention, extraction of the cut-off frequency is easy compared to the conventional planar ring-type plasma diagnosis apparatus, and accordingly, reliable plasma density measurement may be performed.

Figure 7:
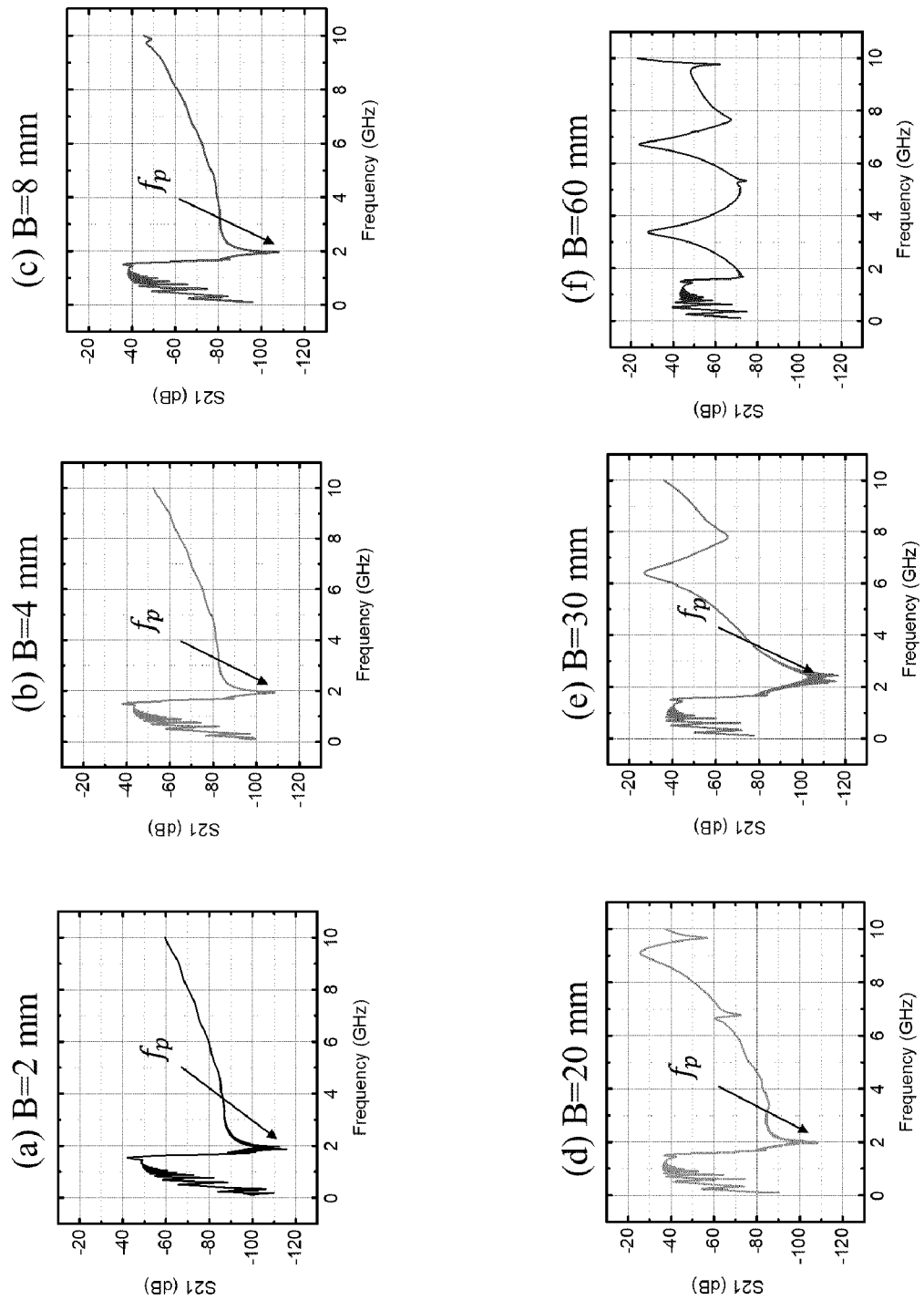
FIG. 7 illustrates a frequency spectrum of a transmission coefficient according to a longitudinal length (B) of the transmission/reception antenna of the present invention in a plasma chamber in which plasma is generated.

FIG. 7 illustrates a frequency spectrum of a transmission coefficient according to the longitudinal length B of the transmission/reception antenna of the present invention in the plasma chamber in which plasma is generated.

Referring to FIG. 7, in the present invention, the peak value of the transmission coefficient is extracted at 2 GHz in the plasma chamber in which plasma is generated, and even when the longitudinal length B of the transmission/reception antenna increases to 2 mm, 4 mm, 8 mm, 20 mm, and 30 mm, the peak value of the transmission coefficient is not affected, and the peak value of the transmission coefficient attributed to the structural resonance characteristics of the plasma chamber and the plasma diagnosis apparatus is extracted only in a frequency region greater than 6 GHz.

However, when the longitudinal length B of the transmission/reception antenna becomes greater than 30 mm, and specifically, in the case of 60 mm, since the peak value of the transmission coefficient attributed to the structural resonance characteristics of the plasma chamber and plasma diagnosis apparatus is extracted in plurality even in the frequency region smaller than 6 GHz, the longitudinal length B of the transmission/reception antenna of the present invention may be 30 mm or less, and the lateral length A of each of the upper surfaces 21 of the transmission antenna 20 and the reception antenna 30 may range from 0.1 to 10 mm.

Figure 8:
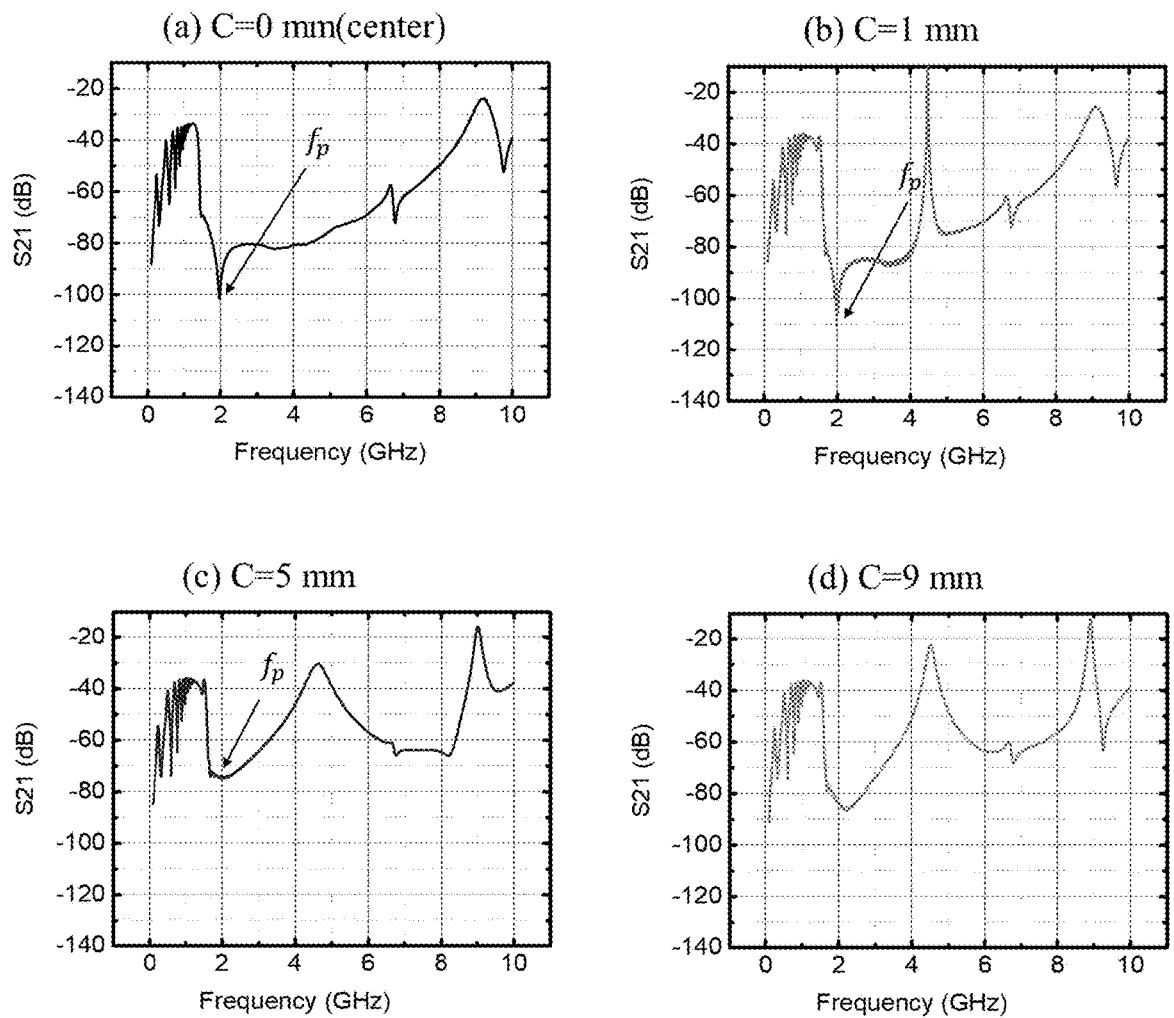
FIG. 8 illustrates a frequency spectrum of a transmission coefficient according to a transmission/reception antenna power applying part (C) of the present invention in a plasma chamber in which plasma is generated.

FIG. 8 illustrates a frequency spectrum of a transmission coefficient according to an antenna power applying part C of the present invention in the plasma chamber in which plasma is generated.

Referring to FIG. 8, the cable 40 from the frequency spectrum analyzer is connected to the antenna power applying part C of the present invention to transmit and receive ultra-high frequency microwaves to analyze the frequency, and when the cable 40 deviates from a center portion of the lower surface 22 of the transmission/reception antenna, since the peak value of the transmission coefficient attributed to the structural resonance characteristics of the plasma chamber and the plasma diagnosis apparatus is extracted in a region of 4 GHz to 5 GHz region, it is difficult to extract the plasma frequency.

In the case in which the longitudinal length B of the lower surface 22 is 20 mm, when the cable 40 from the frequency spectrum analyzer is connected beyond a distance of 5 mm from the center of the longitudinal length B of the lower surface 22, since the peak value of the transmission coefficient attributed to structural resonance characteristics of the chamber and the plasma diagnosis apparatus is extracted, and thus it is difficult to extract the plasma frequency, when the longitudinal length B of the lower surface 22 is 20 mm, the cable 40 from the frequency spectrum analyzer may be connected to the antenna power applying part C of the present invention at a position of 5 mm or less from the center of the longitudinal length B of the lower surface 22. That is, the cable which transmits or receives the ultra-high frequency may be connected in the range from the center of the longitudinal length B of the lower surface 22 to a quarter of the longitudinal length B of the lower surface 22.

Figure 9:
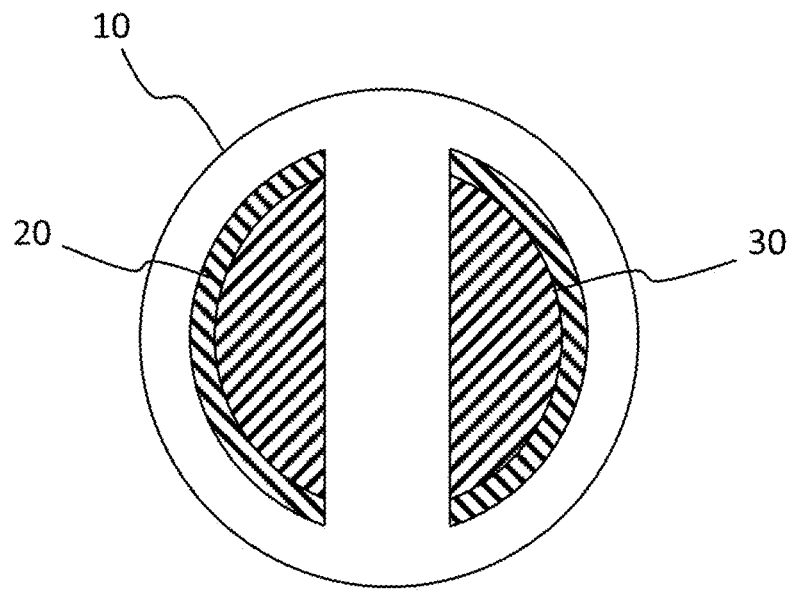
FIG. 9 illustrates another embodiment of a specific shape of the transmission/reception antenna of the planar-type plasma diagnosis apparatus of the present invention.

FIG. 9 illustrates another embodiment of a specific shape of the transmission/reception antenna of the planar-type plasma diagnosis apparatus of the present invention.

Referring to FIG. 9, each of the upper surface 21 which applies microwaves of the transmission antenna 20 and the upper surface 21 which receives microwaves of the reception antenna 30 has a semicircular planar shape, and the transmission antenna 20 and the reception antenna 30 have a structure in which chords of the upper surfaces 21 of the transmission antenna 20 and the reception antenna 30 face each other.

When the body part 10 has a circular shape, the upper surfaces 21 of the transmission antenna 20 and the reception antenna 30 may be formed in the semicircular planar shapes so that areas of the upper surfaces 21 of the transmission antenna 20 and the reception antenna 30 may be formed wider to increase the intensity of a signal, and since the chords of the semicircular planes of the transmission antenna 20 and the reception antenna 30 are disposed to face each other, capacitive coupling may increase and the intensity of the transmitted signal may be maintained strong.

Further, the transmission antenna 20 and the reception antenna 30 may have semicircular pillar shapes disposed in the body part 10 to be adjacent to and face each other.

Figure 10:
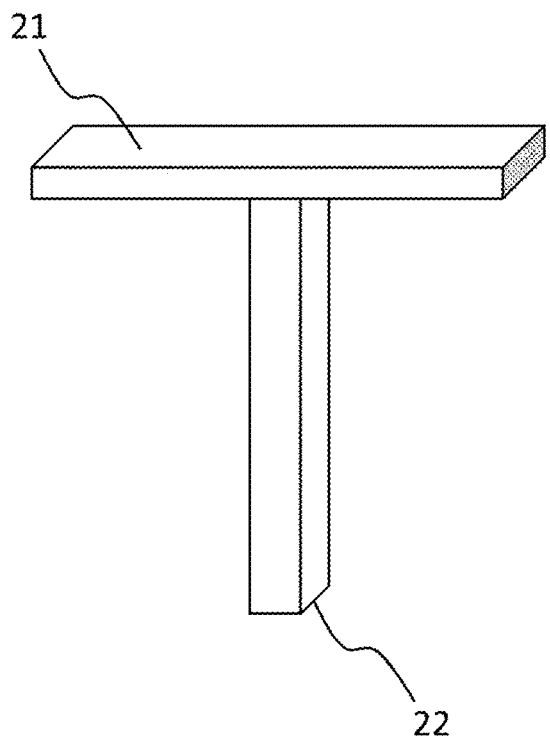
FIG. 10 illustrates still another embodiment of a specific shape of the transmission/reception antenna of the planar-type plasma diagnosis apparatus of the present invention.

FIG. 10 illustrates still another embodiment of a specific shape of the transmission/reception antenna of the planar-type plasma diagnosis apparatus of the present invention.

Referring to FIG. 10, since the upper surface 21 of the transmission antenna 20 or the reception antenna 30 of the present invention is formed in a rectangular planar shape, and the lower surface 22 from the upper surface 21 is formed as a pillar portion, manufacturing costs of the transmission antenna 20 and the reception antenna 30 may be reduced while capacitive coupling on the upper surface 21 is largely maintained. Further, a position of the pillar portion may be located at the center portion or edge of the upper surface 21.

In addition, although not shown in the drawings, since the upper surface 21 of the transmission antenna 20 or the reception antenna 30 of the present invention is formed in the semicircular planar shape, and the lower surface 22 from the upper surface 21 is formed as the pillar portion, manufacturing costs of the transmission antenna 20 and the reception antenna 30 may be reduced while the capacitive coupling on the upper surface 21 is largely maintained. Further, the position of the pillar portion may be located at the center portion or the edge of the upper surface 21.

Figure 11:
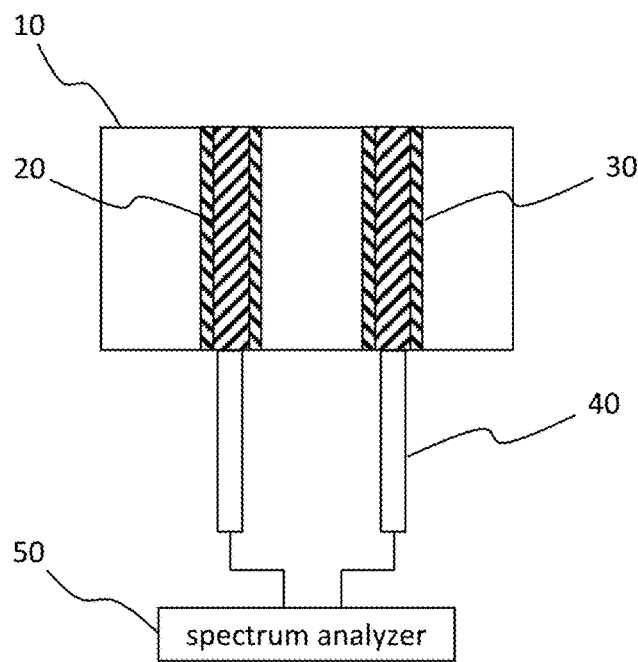
FIG. 11 illustrates a configuration in which a spectrum analyzer is connected to the transmission/reception antenna of the planar-type plasma diagnosis apparatus of the present invention.

FIG. 11 illustrates a configuration in which a spectrum analyzer is connected to the transmission/reception antenna of the planar-type plasma diagnosis apparatus of the present invention.

Referring to FIG. 11, the cable 40 from the frequency spectrum analyzer 50 is connected through the lower surface 22 of the transmission antenna 20 or the reception antenna 30 of the present invention, the transmission antenna 20 receives power from the frequency spectrum analyzer 50 to transmit the ultra-high frequency microwaves, and the ultra-high frequency microwaves transmitted from the transmission antenna 20 are received by the reception antenna 30 after passing through a plasma space so that the frequency spectrum analyzer 50 extracts and analyzes the frequency spectrum.

Figure 12:
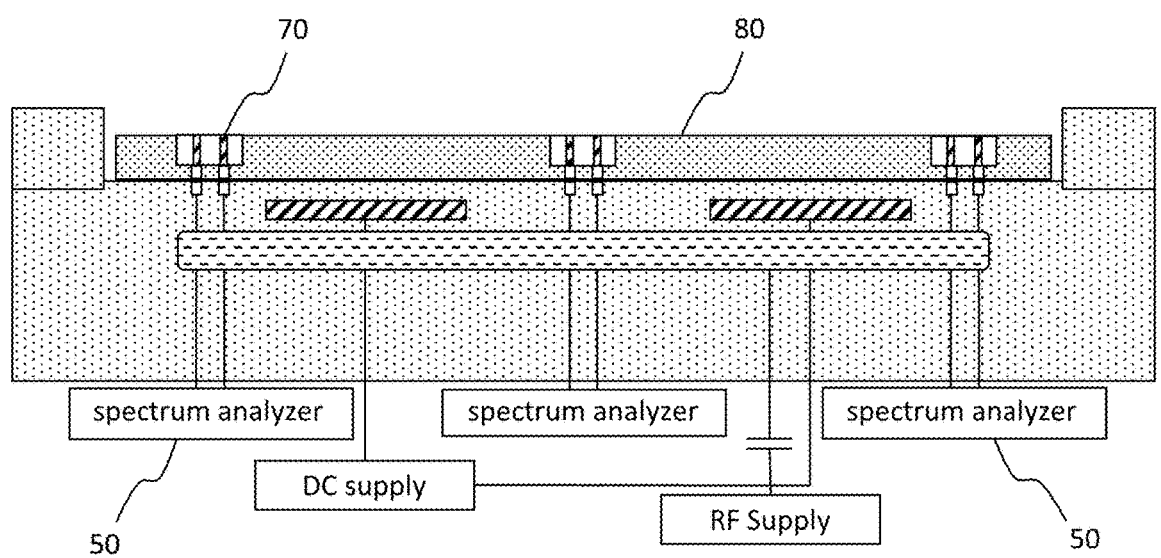
FIG. 12 illustrates one embodiment of a wafer-type plasma diagnosis apparatus in which the planar-type plasma diagnosis apparatus of the present invention is buried.

FIG. 12 illustrates one embodiment of a wafer-type plasma diagnosis apparatus in which the planar-type plasma diagnosis apparatus of the present invention is buried.

Referring to FIG. 12, in the wafer-type plasma diagnosis apparatus in which the planar-type plasma diagnosis apparatus of the present invention is buried, a planar-type plasma diagnosis apparatus 70 is buried in a center portion or an edge of a circular member 80 to be formed, and the wafer-type plasma diagnosis apparatus is placed on an electrostatic chuck and connected to the spectrum analyzer 50 to measure the uniformity of the plasma space.

Since the wafer-type plasma diagnosis apparatus may be easily applied to a conventional plasma chamber, there is an effect in that plasma diagnosis can be performed while minimizing a structure change of the conventional plasma chamber.

Figure 13:
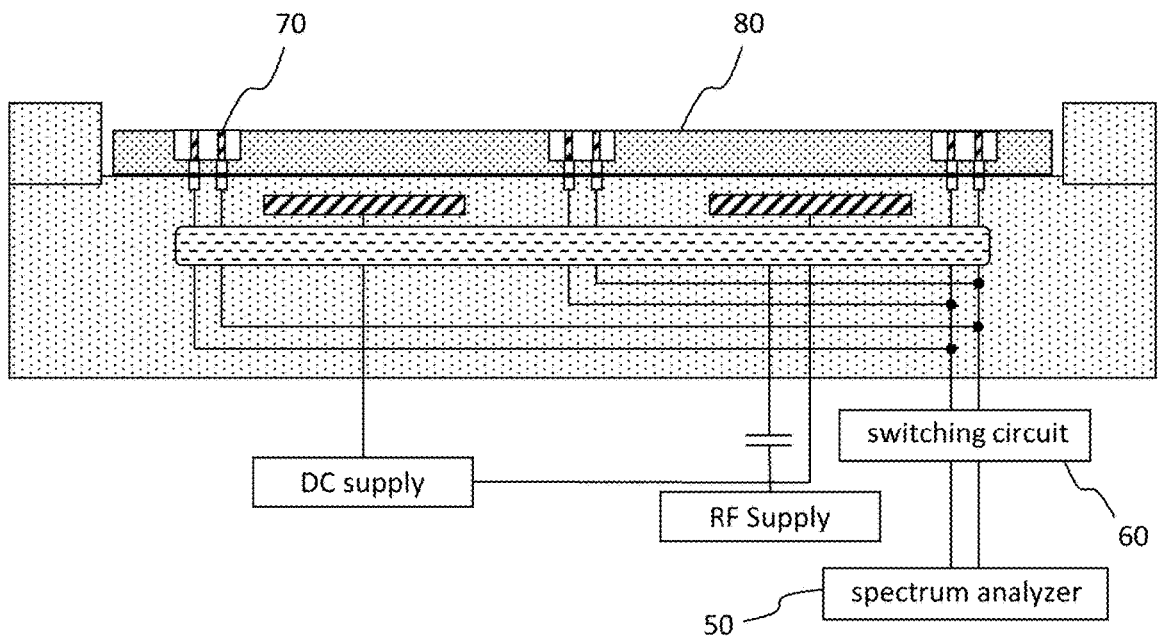
FIG. 13 illustrates another embodiment of the wafer-type plasma diagnosis apparatus in which the planar-type plasma diagnosis apparatus of the present invention is buried.

FIG. 13 illustrates another embodiment of the wafer-type plasma diagnosis apparatus in which the planar-type plasma diagnosis apparatus of the present invention is buried.

Referring to FIG. 13, the planar-type plasma diagnosis apparatuses 70 are buried in the center portion or the edge of the circular member 80 to be formed, and the wafer-type plasma diagnosis apparatus is placed on the electrostatic chuck and connected to one spectrum analyzer 50 in parallel to measure the uniformity of the plasma space. Accordingly, by using an expensive spectrum analyzer 50 efficiently, the uniformity of the plasma space may be measured by a plurality of planar-type plasma diagnosis apparatuses 70 at low cost.

The spectrum analyzer 50 is formed with different lengths of wires connected to the plurality of planar-type plasma diagnosis apparatuses 70 so that each of the planar-type plasma diagnosis apparatuses 70 may be operated by distinguishing time differences between signals transmitted and received between the spectrum analyzer 50 and the plurality of planar-type plasma diagnosis apparatuses 70.

Further, a switching circuit 60 is provided between the spectrum analyzer 50 and the plurality of planar-type plasma diagnosis apparatuses 70 so that each of the planar-type plasma diagnosis apparatuses 70 may be operated by distinguishing time differences between signals transmitted and received between the spectrum analyzer 50 and the plurality of planar-type plasma diagnosis apparatuses 70 by a switching operation.

In addition, a length difference of the wires is used for distinguishing for transmission and the switching operation is used for distinguishing for reception, or conversely, the length difference of the wires is used for distinguishing for reception and the switching operation is used for distinguishing for transmission, so that each of the planar-type plasma diagnosis apparatuses 70 may be operated.

Figure 14A:
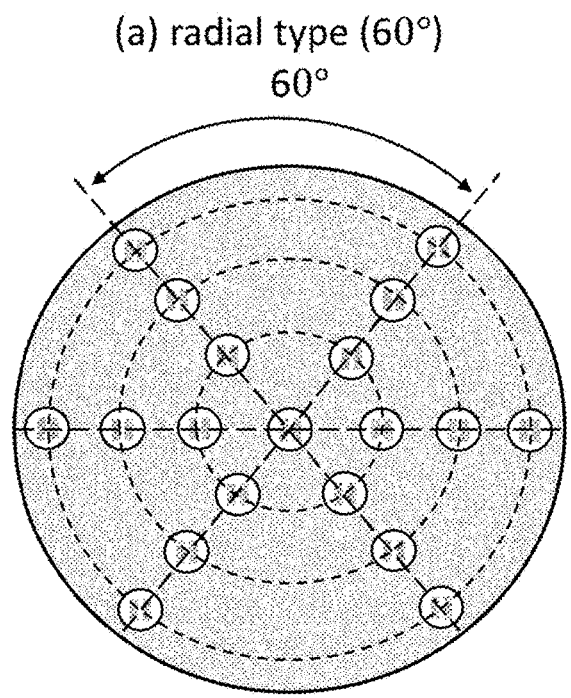
FIG. 14(a), FIG. 14(b) and FIG. 14(c) illustrate a wafer-type plasma diagnosis apparatus or an electrostatic chuck in which the planar-type plasma diagnosis apparatuses of the present invention are radially buried.
Figure 14B:
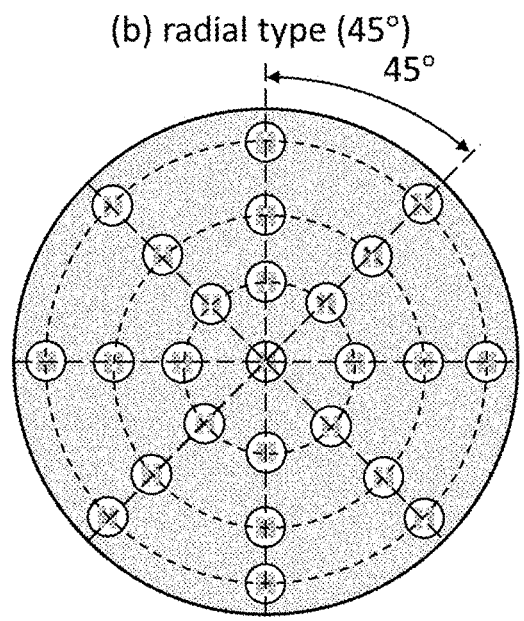
Figure 14C:
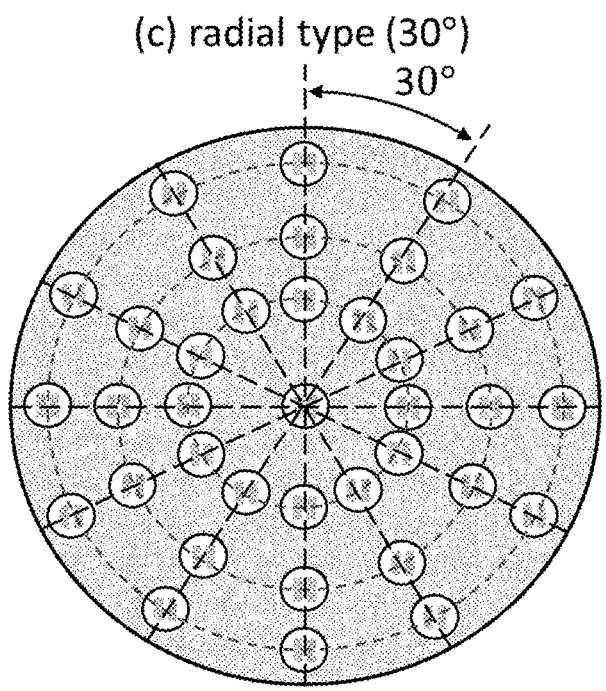
Figure 15A:
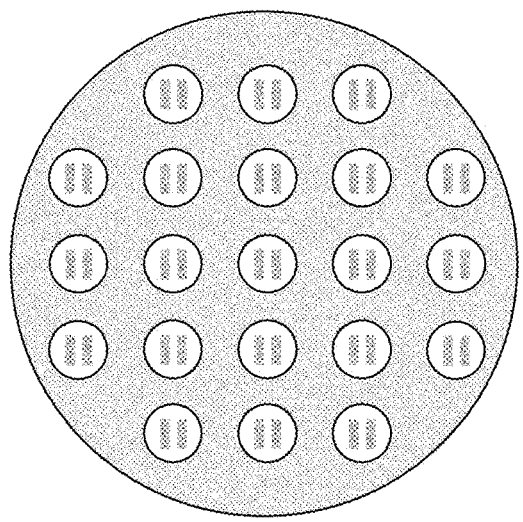
FIG. 15(a) and FIG. 15(b) illustrate a wafer-type plasma diagnosis apparatus or an electrostatic chuck in which the planar-type plasma diagnosis apparatuses of the present invention are buried in a lattice shape or a cross shape.
Figure 15B:
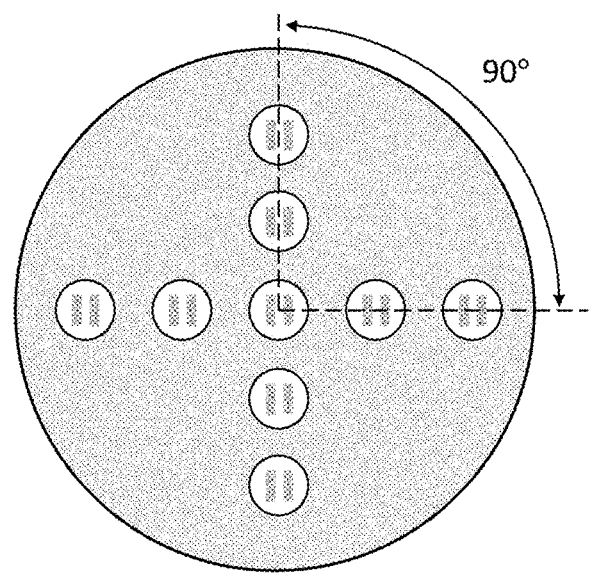

FIG. 14 illustrates a wafer-type plasma diagnosis apparatus in which the planar-type plasma diagnosis apparatuses of the present invention are radially buried, and FIG. 15 illustrates a wafer-type plasma diagnosis apparatus in which the planar-type plasma diagnosis apparatuses of the present invention are buried in a lattice shape or a cross shape.

Referring to FIGS. 14 and 15, a plurality of planar-type plasma diagnosis apparatuses 70 are buried in the circular member 80 so that plasma space uniformity may be more precisely measured. Accordingly, in a semiconductor process, the plasma space uniformity from a center to an edge of a wafer may be precisely measured, and a yield of the wafer may be further enhanced, and even when multiple planar-type plasma diagnosis apparatuses 70 are buried in the circular member 80, the planar-type plasma diagnosis apparatuses may be connected to one spectrum analyzer 50 in parallel to enable analysis.

Further, when the cable 40 from the frequency spectrum analyzer 50 is connected by wires through the lower surface 22 of the transmission antenna 20 or the reception antenna 30 of the planar-type plasma diagnosis apparatus of the present invention, an upper surface of the electrostatic chuck may be provided with a terminal.

In addition, a wireless transmission/reception apparatus may be provided in the circular member 80 and signals from the transmission antenna 20 and the reception antenna 30 of the planar-type plasma diagnosis apparatus may be wirelessly connected to the frequency spectrum analyzer 50. However, even in this wireless connection, it is difficult to transmit the signals due to an effect of the plasma frequency, but since the transmission antenna 20 and the reception antenna 30 of the planar-type plasma diagnosis apparatus transmit or receive radio signals through a lower direction of the electrostatic chuck or a horizontal direction of the electrostatic chuck, wireless signals may be transmitted by avoiding the plasma space.

In addition, a memory is additionally provided in the circular member 80 to store the signals from the transmission antenna 20 and the reception antenna 30 of the planar-type plasma diagnosis apparatus, and the signals from the transmission antenna 20 and the reception antenna 30 stored in the memory may be read when the circular member 80 comes out of the plasma chamber or the plasma process stops.

Figure 16:
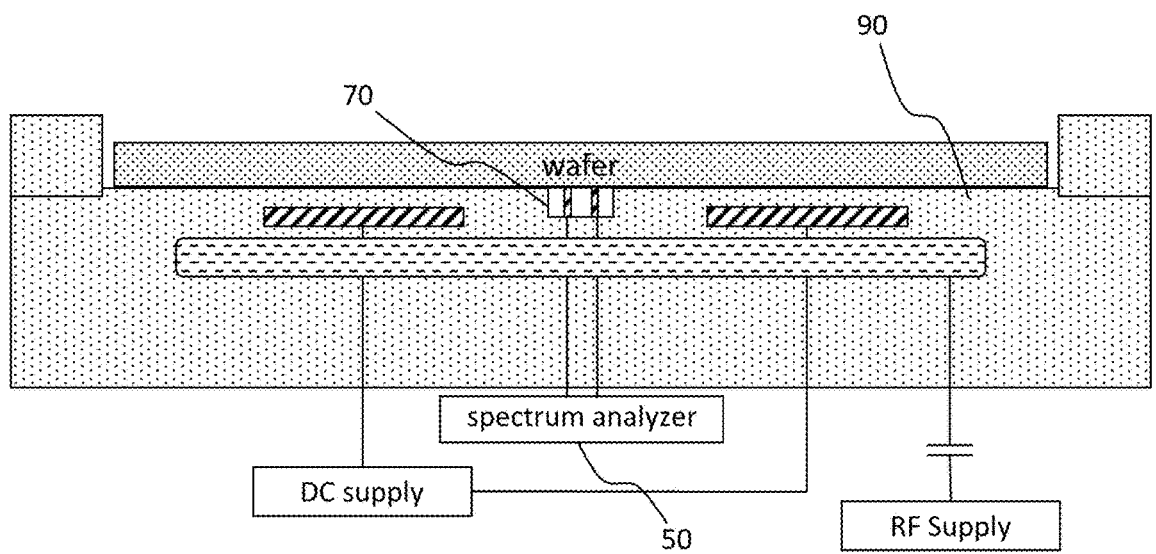
FIG. 16 illustrates one embodiment of the electrostatic chuck in which the planar-type plasma diagnosis apparatus of the present invention is buried.

FIG. 16 illustrates one embodiment of an electrostatic chuck in which the planar-type plasma diagnosis apparatus of the present invention is buried.

Referring to FIG. 16, in an electrostatic chuck 90 in which the planar-type plasma diagnosis apparatus of the present invention is buried, the planar-type plasma diagnosis apparatus 70 is buried in a center portion of the electrostatic chuck 90, and the planar-type plasma diagnosis apparatus 70 is connected to the spectrum analyzer 50 to measure the uniformity of the plasma space at a wafer center portion in real time during the plasma process.

The electrostatic chuck 90 has an effect in that it is possible to easily measure the uniformity of the plasma space even during the plasma process, and it is possible to measure the uniformity of the plasma space even when the wafer is placed on the electrostatic chuck 90.

Figure 17:
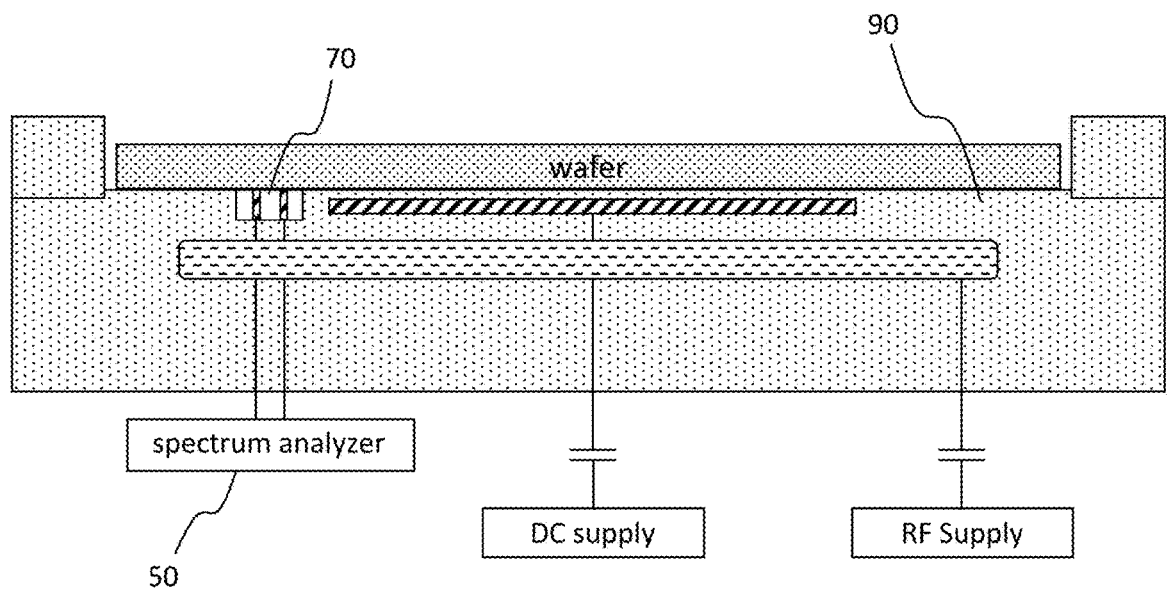
FIG. 17 illustrates another embodiment of the electrostatic chuck in which the planar-type plasma diagnosis apparatus of the present invention is buried.

FIG. 17 illustrates another embodiment of the electrostatic chuck in which the planar-type plasma diagnosis apparatus of the present invention is buried.

Referring to FIG. 17, the planar-type plasma diagnosis apparatus 70 is buried between the center portion and the edge of the electrostatic chuck 90, and the planar-type plasma diagnosis apparatus 70 is connected to the spectrum analyzer 50 to measure the uniformity of the plasma space at the wafer center portion and the wafer edge in real time during the plasma process.

Since the plasma density near the wafer is more important in the plasma process, the uniformity of the plasma space has to be measured at critical points near the wafer.

Figure 18:
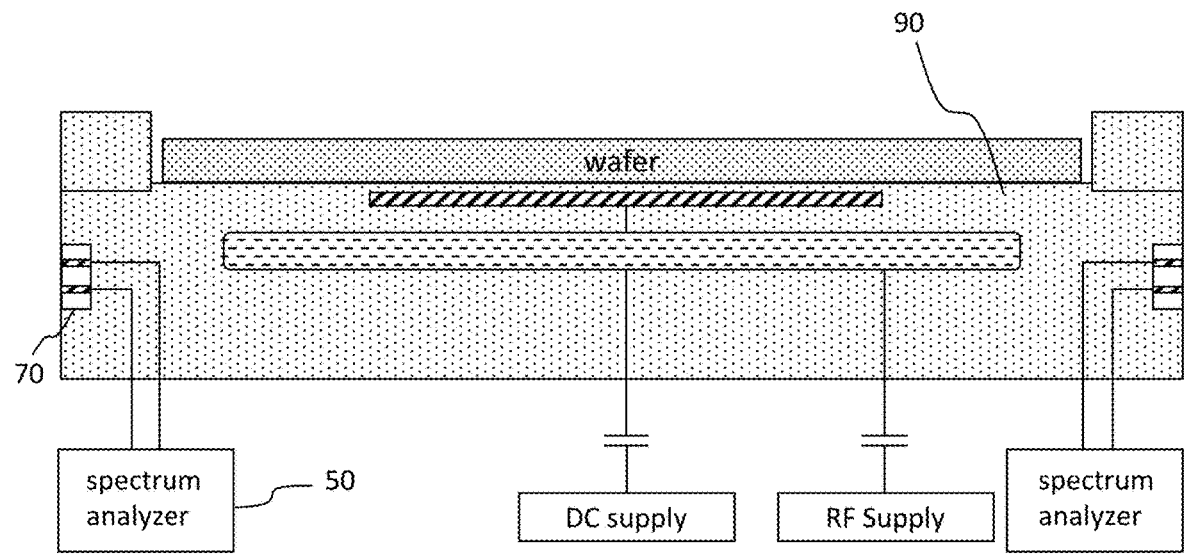
FIG. 18 illustrates still another embodiment of the electrostatic chuck in which the planar-type plasma diagnosis apparatus of the present invention is buried.

FIG. 18 illustrates still another embodiment of the electrostatic chuck in which the planar-type plasma diagnosis apparatus of the present invention is buried.

Referring to FIG. 18, the planar-type plasma diagnosis apparatus 70 is buried in a side surface portion of the electrostatic chuck 90 to face an outer side, and the planar-type plasma diagnosis apparatus 70 is connected to the spectrum analyzer 50 to measure overall uniformity of the plasma space in the plasma chamber in real time during the plasma process.

Figure 19:
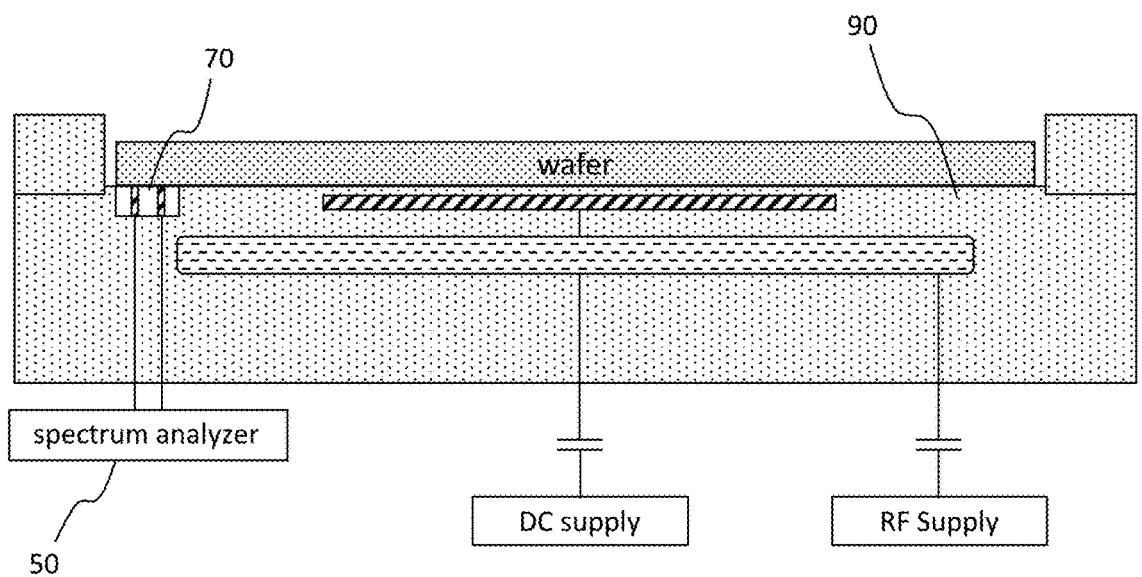
FIG. 19 illustrates yet another embodiment of the electrostatic chuck in which the planar-type plasma diagnosis apparatus of the present invention is buried.
Figure 20:
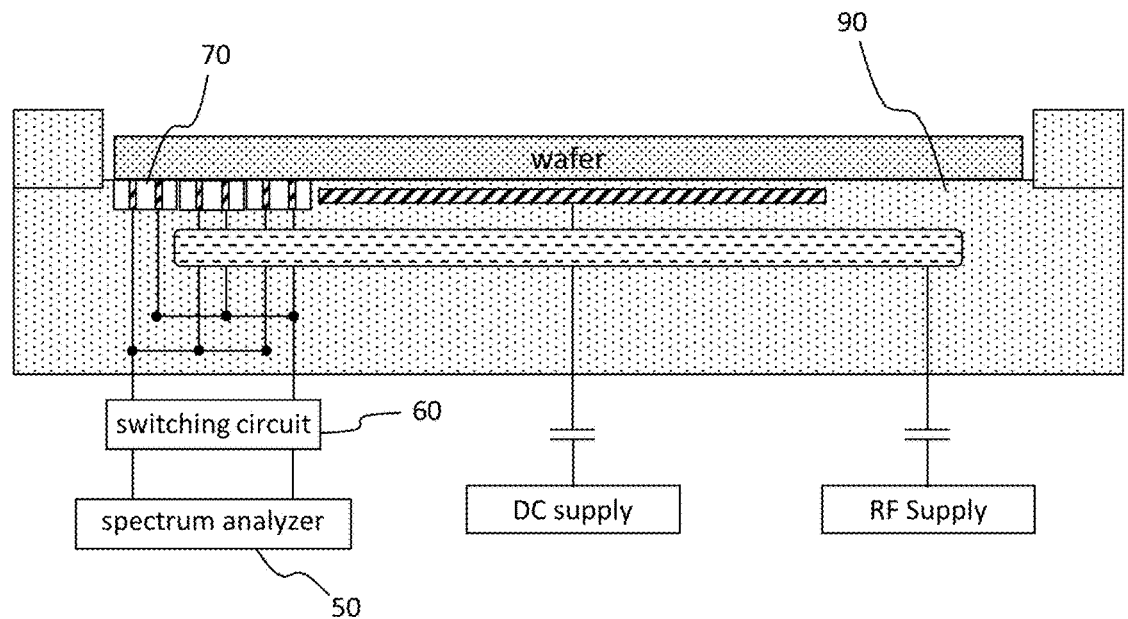
FIG. 20 illustrates yet another embodiment of the electrostatic chuck in which the planar-type plasma diagnosis apparatus of the present invention is buried.

FIGS. 19 and 20 illustrate yet other embodiments of the electrostatic chuck in which the planar-type plasma diagnosis apparatus of the present invention is buried.

Referring to FIG. 19, the planar-type plasma diagnosis apparatus 70 is buried in the edge of the electrostatic chuck 90, and the planar-type plasma diagnosis apparatus 70 is connected to the spectrum analyzer 50 to measure the uniformity of the plasma space at the wafer edge in real time during the plasma process.

Referring to FIG. 20, multiple planar-type plasma diagnosis apparatuses 70 are buried in the edge of the electrostatic chuck 90, and the planar-type plasma diagnosis apparatuses 70 are connected to the spectrum analyzer 50 to measure the uniformity of the plasma space at the wafer edge in real time during the plasma process. Recently, in order to further increase a yield of a semiconductor chip by reducing a defect rate at the wafer edge, plasma density measurement at the wafer edge is more and more important.

Figure 21:
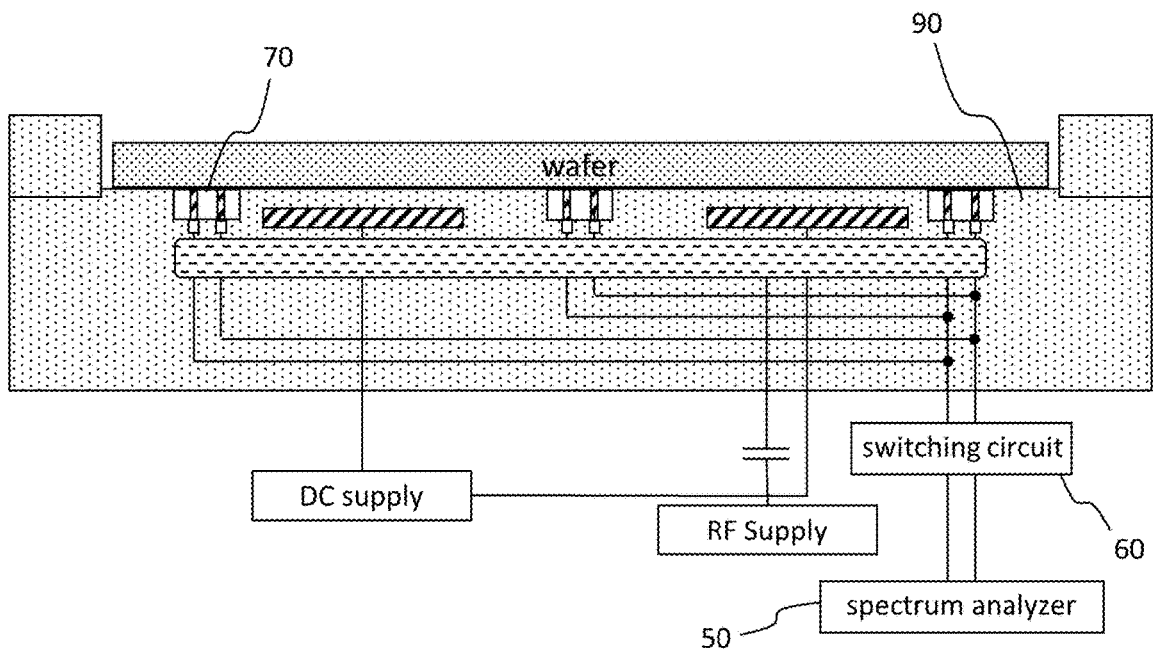
FIG. 21 illustrates yet another embodiment of the electrostatic chuck in which the planar-type plasma diagnosis apparatus of the present invention is buried.
Figure 22A:
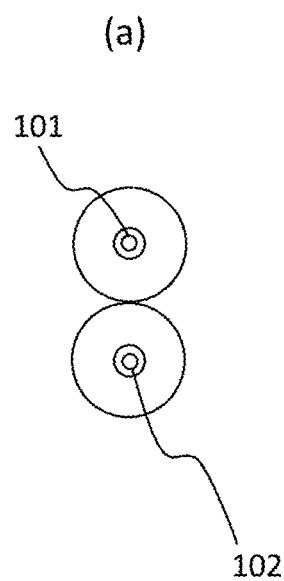
FIG. 22(a) and FIG. 22(b) illustrate a specific shape of a transmission/reception antenna of a bar-shaped probe according to the conventional art.
Figure 22B:
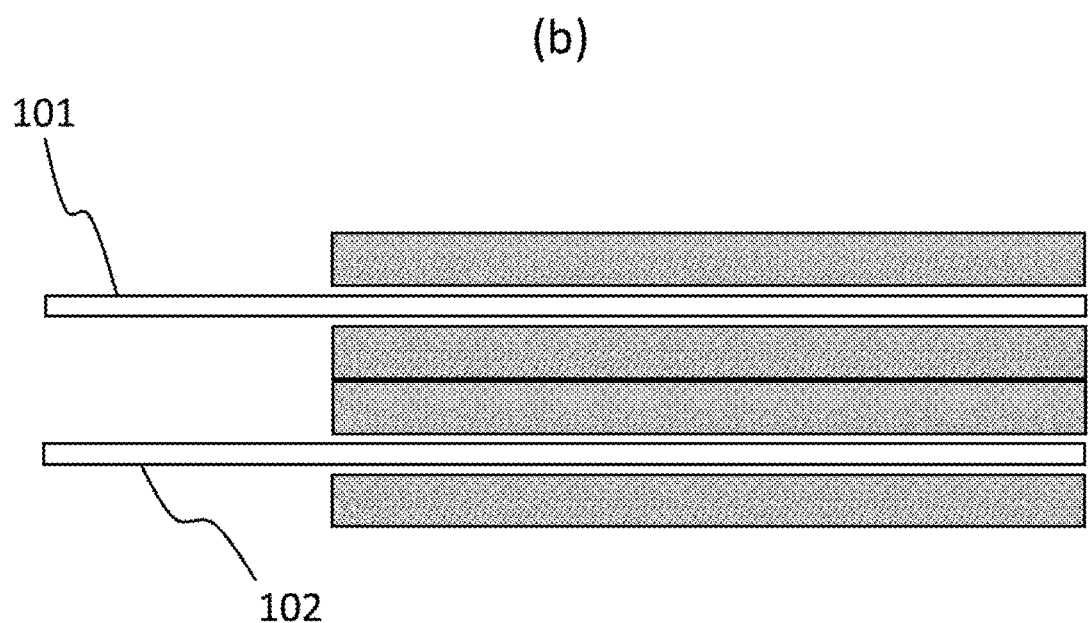
Figure 23A:
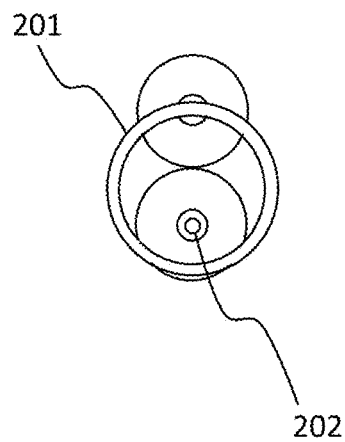
FIG. 23(a) and FIG. 23(b) illustrate specific shapes of a bar-shaped radiation antenna and a loop-shaped reception antenna according to the conventional art.
Figure 23B:
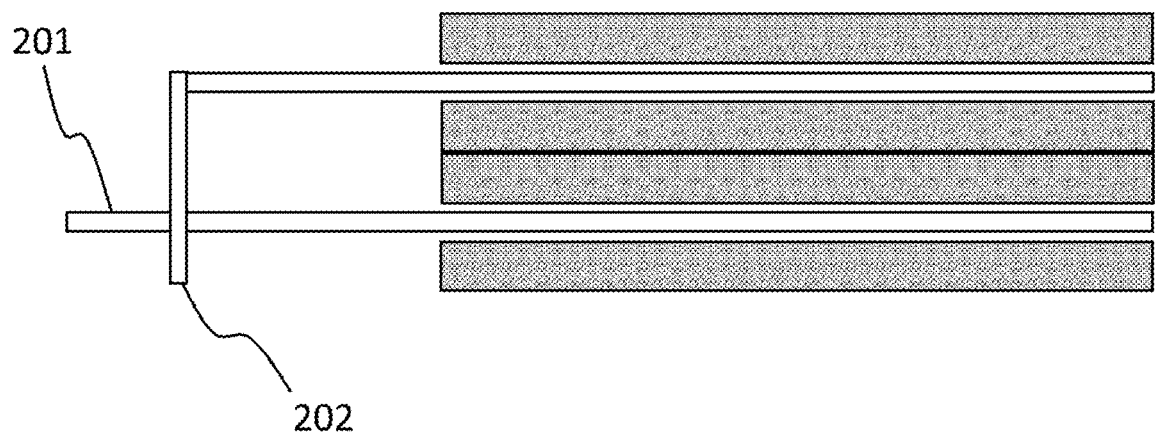
Figure 24A:
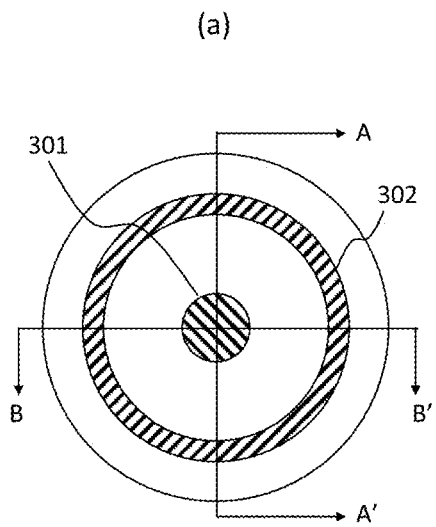
FIG. 24(a), FIG. 24(b) and FIG. 24(c) illustrate a specific shape of a planar ring-type plasma diagnosis apparatus according to the conventional art.
Figure 24B:
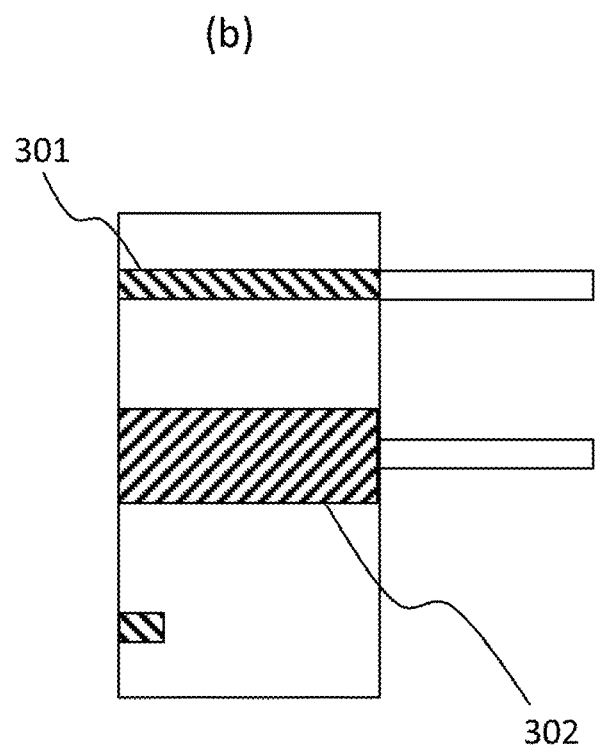
Figure 24C:
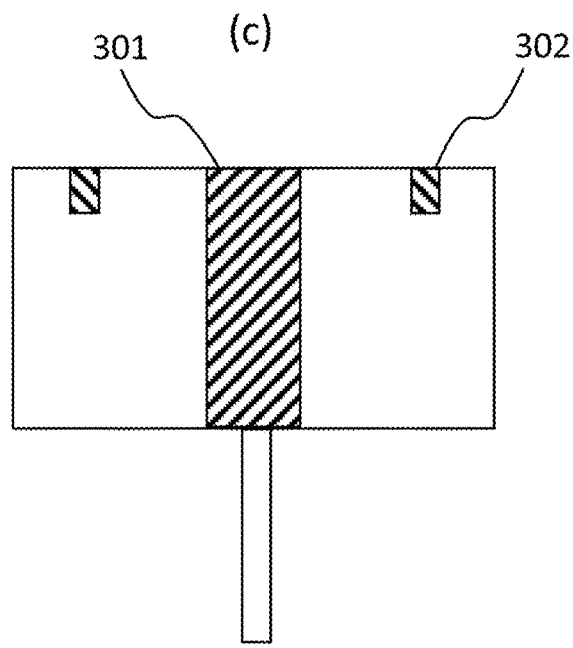
Figure 25A:
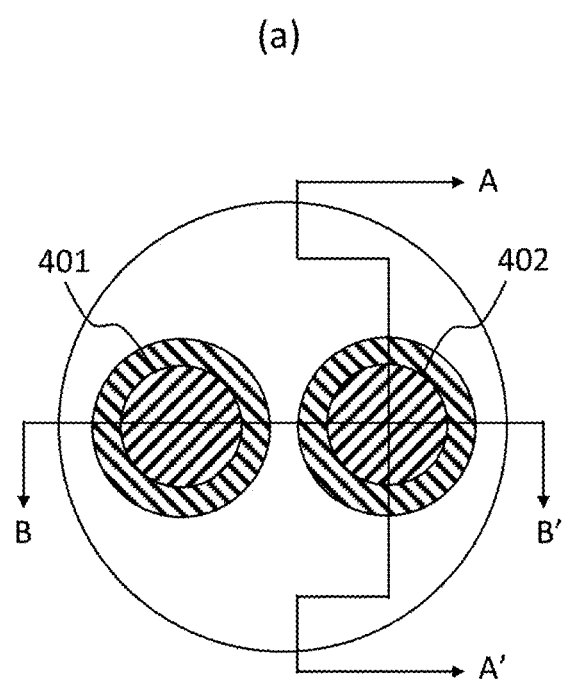
FIG. 25(a), FIG. 25(b) and FIG. 25(c) illustrate a specific shape of a planar conical-type plasma diagnosis apparatus according to the conventional art.
Figure 25B:
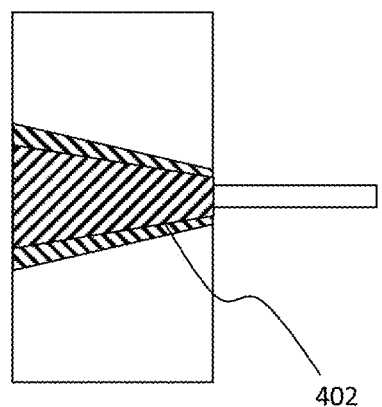
Figure 25C:
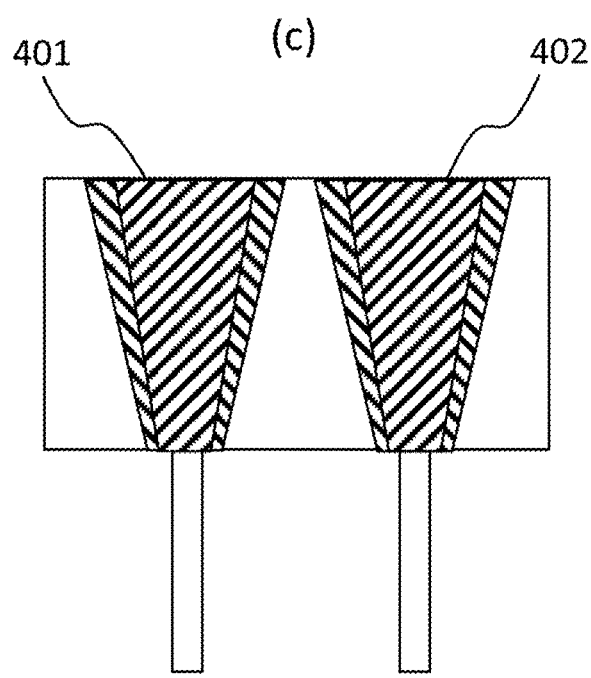

FIG. 21 illustrates yet another embodiment of the electrostatic chuck in which the planar-type plasma diagnosis apparatus of the present invention is buried.

Referring to FIG. 21, the planar-type plasma diagnosis apparatuses 70 are buried in the center portion and the edge of the electrostatic chuck 90 to be formed, and are connected to one spectrum analyzer 50 in parallel to measure uniformity according to a position even when symmetry of the plasma space is broken. Accordingly, by using the expensive spectrum analyzer 50 efficiently, the uniformity of the plasma space may be measured by the plurality of planar-type plasma diagnosis apparatuses 70 at low cost.

The spectrum analyzer 50 is formed with different lengths of the wires connected to the plurality of planar-type plasma diagnosis apparatuses 70 so that each of the planar-type plasma diagnosis apparatuses 70 may be operated by distinguishing the time differences between the signals transmitted and received between the spectrum analyzer 50 and the plurality of planar-type plasma diagnosis apparatuses 70.

Further, the switching circuit 60 is provided between the spectrum analyzer 50 and the plurality of planar-type plasma diagnosis apparatuses 70 so that each of the planar-type plasma diagnosis apparatuses 70 may be operated by distinguishing the time differences between the signals transmitted and received between the spectrum analyzer 50 and the plurality of planar-type plasma diagnosis apparatuses 70 by the switching operation.

In addition, the length difference of the wires is used for distinguishing for transmission and the switching operation is used for distinguishing for reception, or conversely, the length difference of the wires is used for distinguishing for reception and the switching operation is used for distinguishing for transmission, so that each of the planar-type plasma diagnosis apparatuses 70 may be operated.

FIG. 14 illustrates an electrostatic chuck in which the planar-type plasma diagnosis apparatuses of the present invention are radially buried, and FIG. 15 illustrates the electrostatic chuck in which the planar-type plasma diagnosis apparatuses of the present invention are buried in a lattice shape or a cross shape.

Referring to FIGS. 14 and 15, a plurality of planar-type plasma diagnosis apparatuses 70 are buried in the electrostatic chuck 90 so that plasma space uniformity may be more precisely measured during the plasma process. Accordingly, in the semiconductor process, uniformity according to the position may be precisely measured, and the yield of the wafer may be further enhanced even when the symmetry of the plasma space is broken from a center to an edge of a wafer, and even when the multiple planar-type plasma diagnosis apparatuses 70 are buried in the electrostatic chuck 90, the planar-type plasma diagnosis apparatuses may be connected to one spectrum analyzer 50 in parallel to enable analysis.

The invention claimed is:

1. A planar-type plasma diagnosis apparatus comprising:
   a transmission antenna configured to apply a frequency-variable microwave to plasma;
   a reception antenna configured to receive the microwave from the plasma; and
   a body part configured to encompass the transmission antenna and the reception antenna so that the transmission antenna and the reception antenna are insulated from each other,
   wherein,
   each of an upper surface of the transmission antenna configured to apply the microwave and an upper surface of the reception antenna configured to receive the microwave has a planar shape,
   the upper surface of the transmission antenna and the upper surface of the reception antenna are horizontally adjacent to each other to face each other, and
   in each of the upper surface of the transmission antenna and the upper surface of the reception antenna, a length from one end to the other end in an opposite direction is smaller than a length from one end to the other end in a direction perpendicular to the opposite direction.

2. The planar-type plasma diagnosis apparatus of claim 1, wherein each of the upper surfaces of the transmission antenna and the reception antenna has a quadrangular shape.

3. The planar-type plasma diagnosis apparatus of claim 2, wherein the transmission antenna and the reception antenna have rectangular parallelepiped shapes disposed in the body part to be adjacent to and face each other.

4. The planar-type plasma diagnosis apparatus of claim 2, wherein:
   a longitudinal length of the upper surface is greater than a lateral length of the upper surface; and
   the longitudinal length of the upper surface of the transmission antenna and the longitudinal length of the upper surface of the reception antenna are disposed to face each other.

5. The planar-type plasma diagnosis apparatus of claim 4, wherein the longitudinal length of each of the upper surfaces of the transmission antenna and the reception antenna ranges from 2 mm to 30 mm.

6. The planar-type plasma diagnosis apparatus of claim 5, wherein the lateral length of each of the upper surfaces of the transmission antenna and the reception antenna ranges from 0.1 mm to 10 mm.

7. The planar-type plasma diagnosis apparatus of claim 1, wherein an interval (D) between the upper surface of the transmission antenna and the upper surface of the reception antenna ranges from 1 mm to 15 mm.

8. The planar-type plasma diagnosis apparatus of claim 1, wherein insulating films are respectively formed on the upper surface of the transmission antenna and the upper surface of the reception antenna.

9. The planar-type plasma diagnosis apparatus of claim 1, wherein a cable configured to transmit or receive an ultra-high frequency is connected through a lower surface of the transmission antenna or the reception antenna facing the upper surface of the transmission antenna or the reception antenna.

10. The planar-type plasma diagnosis apparatus of claim 9, wherein the cable configured to transmit or receive the ultra-high frequency is connected in a range from a center of a longitudinal length of the lower surface to a quarter of the longitudinal length.

11. A wafer-type plasma diagnosis apparatus with a planar-type plasma diagnosis apparatus embedded therein, comprising a circular member in which at least one planar-type plasma diagnosis apparatus is embedded,
    wherein,
    the planar-type plasma diagnosis apparatus includes a transmission antenna configured to apply a frequency-variable microwave to plasma, a reception antenna configured to receive the microwave from the plasma, and a body part configured to encompass the transmission antenna and the reception antenna so that the transmission antenna and the reception antenna are insulated from each other,
    each of an upper surface of the transmission antenna configured to apply the microwave and an upper surface of the reception antenna configured to receive the microwave has a planar shape,
    the upper surface of the transmission antenna and the upper surface of the reception antenna are horizontally adjacent to each other to face each other, and
    in each of the upper surface of the transmission antenna and the upper surface of the reception antenna, a length from one end to the other end in an opposite direction is smaller than a length from one end to the other end in a direction perpendicular to the opposite direction.

12. The wafer-type plasma diagnosis apparatus of claim 11, wherein the planar-type plasma diagnosis apparatus is embedded in a center portion or an edge of the circular member.

13. The wafer-type plasma diagnosis apparatus of claim 11, wherein the planar-type plasma diagnosis apparatus is embedded in plurality in the circular member.

14. The wafer-type plasma diagnosis apparatus of claim 13, wherein the planar-type plasma diagnosis apparatus is radially embedded in plurality from the center portion of the circular member.

15. The wafer-type plasma diagnosis apparatus of claim 13, wherein the planar-type plasma diagnosis apparatus is embedded in plurality in the circular member in a lattice shape or a cross shape.

16. An electrostatic chuck in which a planar-type plasma diagnosis apparatus is embedded,
    wherein,
    the planar-type plasma diagnosis apparatus includes a transmission antenna configured to apply a frequency-variable microwave to plasma, a reception antenna configured to receive the microwave from the plasma, and a body part configured to encompass the transmission antenna and the reception antenna so that the transmission antenna and the reception antenna are insulated from each other,
    each of an upper surface of the transmission antenna configured to apply the microwave and an upper surface of the reception antenna configured to receive the microwave has a planar shape,
    the upper surface of the transmission antenna and the upper surface of the reception antenna are horizontally adjacent to each other to face each other,
    in each of the upper surface of the transmission antenna and the upper surface of the reception antenna, a length from one end to the other end in an opposite direction is smaller than a length from one end to the other end in a direction perpendicular to the opposite direction, and the planar-type plasma diagnosis apparatus is embedded in a surface of the electrostatic chuck.

17. The electrostatic chuck of claim 16, wherein the planar-type plasma diagnosis apparatus is buried in a center portion or an edge of the electrostatic chuck.

18. The electrostatic chuck of claim 16, wherein the planar-type plasma diagnosis apparatus is embedded in plurality.

19. The electrostatic chuck of claim 18, wherein the planar-type plasma diagnosis apparatus is radially embedded in plurality from a center portion of the electrostatic chuck.

20. The electrostatic chuck of claim 18, wherein the planar-type plasma diagnosis apparatus is embedded in plurality in a lattice shape or a cross shape.

* * * * *